US012810370B2

(12) United States Patent
Vaujour et al.

(10) Patent No.: US 12,810,370 B2
(45) Date of Patent: Nov. 24, 2026

(54) SYSTEMS AND METHODS FOR DESCRIBING, SIMULATING AND OPTIMIZING SPACEBORNE SYSTEMS AND MISSIONS

(71) Applicant: Loft Orbital Technologies S.A.S, Toulouse (FR)

(72) Inventors: Pierre-Damien Vaujour, San Francisco, CA (US); Lucas Bremond, San Francisco, CA (US); Pieter van Duijn, San Francisco, CA (US); Pierre Bertrand, Paris (FR)

(73) Assignee: Loft Orbital Technologies S.A.S, Toulouse (FR)

( * ) Notice: Subject to any disclaimer, the term of this patent is extended or adjusted under 35 U.S.C. 154(b) by 0 days.

(21) Appl. No.: 18/670,940

(22) Filed: May 22, 2024

(65) Prior Publication Data

US 2024/0311945 A1 Sep. 19, 2024

Related U.S. Application Data

(63) Continuation of application No. 18/297,216, filed on Apr. 7, 2023, now Pat. No. 12,026,796, which is a continuation of application No. 17/402,376, filed on Aug. 13, 2021, now Pat. No. 11,651,466, which is a continuation of application No. 16/945,319, filed on Jul. 31, 2020, now Pat. No. 11,127,102.

(Continued)

(51) Int. Cl.

| | |
|---|---|
| ***G06Q 50/40*** | (2024.01) |
| ***B64G 1/00*** | (2006.01) |
| ***B64G 1/24*** | (2006.01) |
| ***B64G 1/26*** | (2006.01) |
| ***G06F 30/20*** | (2020.01) |
| ***G06Q 10/0631*** | (2023.01) |
| ***G06Q 10/10*** | (2023.01) |
| ***G06Q 30/0201*** | (2023.01) |

(52) U.S. Cl.

CPC ............. *G06Q 50/40* (2024.01); *B64G 1/002* (2013.01); *B64G 1/24* (2013.01); *B64G 1/242* (2013.01); *G06F 30/20* (2020.01); *G06Q 10/06315* (2013.01); *G06Q 10/103* (2013.01); *G06Q 30/0206* (2013.01); *B64G 1/247* (2023.08); *B64G 1/26* (2013.01)

(58) Field of Classification Search

CPC ............. G06Q 50/40; G06Q 10/06315; G06Q 10/103; G06Q 30/0206; B64G 1/24; B64G 1/247; G06F 30/20

See application file for complete search history.

(56) References Cited

U.S. PATENT DOCUMENTS

2018/0239948 A1 * 8/2018 Rutschman ............... G06T 7/20

OTHER PUBLICATIONS

Araguz (Araguz, C., Marí, M., Bou-Balust, E., Alarcon, E., & Selva, D. (2018). Design guidelines for general-purpose payload-oriented nanosatellite software architectures. Journal of aerospace information systems, 15(3), 107-119.) (Year: 2018).*

(Continued)

*Primary Examiner* — Bijan Mapar

(74) *Attorney, Agent, or Firm* — FENWICK & WEST LLP

(57) ABSTRACT

Systems and methods for describing, simulating and/or optimizing spaceborne systems and missions. Configurations for spaceborne systems are generated and validated based on simulation output.

20 Claims, 15 Drawing Sheets

Related U.S. Application Data

(60) Provisional application No. 62/881,624, filed on Aug. 1, 2019.

(56) References Cited

OTHER PUBLICATIONS

Gadepalli (Gadepalli, P. K., Peach, G., Parmer, G., Espy, J., & Day, Z. (Apr. 2019). Chaos: a system for criticality-aware, multi-core coordination. In 2019 IEEE Real-Time and Embedded Technology and Applications Symposium (RTAS) (pp. 77-89). IEEE.) (Year: 2019).*

Jian, L., & Cheng, W. (Jun. 2008). Resource planning and scheduling of payload for satellite with genetic particles swarm optimization. In 2008 IEEE congress on evolutionary computation (IEEE world congress on computational intelligence) (pp. 199-203). IEEE. (Year: 2008).*

Colombi, J. M. et al. "Optimal Launch Manifesting for Heterogeneous Disaggregated Satellite Constellations." Journal of Spacecraft and Rockets, vol. 54, No. 3, May-Jun. 2017, pp. 582-591.

Cuco, A. P. C. et al. "A Multi-Objective Methodology for Spacecraft Equipment Layouts." Optimization and Engineering, vol. 16, No. 1, 2015, pp. 165-181.

DLR. "Virtual Satellite." DLR Simulation and Software Technology, 2 pages, [Online] [Retrieved Jul. 20, 2020], Retrieved from the Internet <URL:https://web.archive.org/web/20180624104621/https://www.dlr.de/sc/en/deskt-opdefault.aspx/tabid-5135/8645read-8374/>.

Mott, K. et al. "Model-Based Heterogeneous Optimal Space Constellation Design." 2018 21st International Conference on Information Fusion (Fusion), Jul. 2018, pp. 602-609.

Reese, K. et al. "Rapid Accommodation of Payloads on the Standard Interface Vehicle Through Use of a Standard Payload Interface." 2013 IEEE Aerospace Conference, 2013, pp. 1-14.

Schoneman, S. et al. "SSO-A: The First Large Commercial Dedicated Rideshare Mission." 32nd Annual AIAA/USU Conference on Small Satellites, Draft, Jun. 21, 2018, pp. 1-10.

Terma. "Simsat Simulators." Terma Space, Space Engineering and Knowledge, Version 2, Jan. 2012, 2 pages.

United States Office Action, U.S. Appl. No. 16/945,319, Sep. 17, 2020, 26 pages.

United States Office Action, U.S. Appl. No. 16/945,319, Dec. 24, 2020, 26 pages.

United States Office Action, U.S. Appl. No. 17/402,376, Nov. 10, 2022, 6 pages.

Chien, S., et al., "A Generalized Timeline Representation, Services, and Interface for Automating Space Mission Operations," Space Ops, Jun. 11, 2012, pp. 1-17.

Chien, S., et al., "Timeline-Based Space Operations Scheduling with External Constraints," Twentieth International Conference on Automated Planning and Scheduling (ICAPS 2010), vol. 20, May 12-16, 2010, pp. 34-41.

United States Office Action, U.S. Appl. No. 18/362,970, Jul. 18, 2024, 21 pages.

United States Office Action, U.S. Appl. No. 18/297,216, Oct. 26, 2023, 16 pages.

Lemaitre, M., Verfaillie, G., Jouhaud, F., Lachiver, J. M., & Bataille, N. (2002). Selecting and scheduling observations of agile satellites. Aerospace Science and Technology, 6(5), 367-381. (Year: 2002).

United States Office Action, U.S. Appl. No. 18/741,052, Apr. 8, 2026, 22 pages.

* cited by examiner

Simulation
125

Mission Definition Data
602

```
<Mission>
      <Objective ID = 1>
            <Sensor ID = High_Resolution_Image>
                  <Parameters Resolution = "100MP"; Format = RGB>
            </Sensor>
            <Trigger ID = 1>
                  Time = 12:00 GMT
                  Frequency = weekly
                  Location  = Peru
                  Duration  = 5hrs
            </Trigger>
            <Trigger ID = 2>
                  Time = 6:00 GMT
                  Frequency = weekly
                  Location  = Brazil
                  Duration  = 5hrs
            </Trigger>
      <Objective>
</Mission>
```

FIGURE 6B

Rideshare Mission
Definition Data
603

```
<Mission ID = 1; CustomerID = User A>
    <Objective ID = 1 Type = data capture>
        <Sensor ID = High_Resolution_Image>
            <Parameters Resolution = “100MP”; Format = RGB>
        </Sensor>
        <Trigger ID = 1>
            Time = 12:00 GMT
            Frequency = weekly
            Location  = Peru
            Duration  = 5hrs
        </Trigger>
        <Trigger ID = 2>
            Time = 6:00 GMT
            Frequency = weekly
            Location  = Brazil
            Duration  = 5hrs
        </Trigger>
    <Objective>
</Mission>

<Mission ID = 2; CustomerID = User B>
  <Objective ID = 1 Type = data capture>
      <Sensor ID = Methane_Spectrometer>
      <Trigger ID = 1>
          Frequency = daily
          Location  = Middle East
          Duration  = 5hrs
      </Trigger>
  <Objective>

</Mission>
```

FIGURE 6C

SYSTEMS AND METHODS FOR DESCRIBING, SIMULATING AND OPTIMIZING SPACEBORNE SYSTEMS AND MISSIONS

CROSS-REFERENCE TO RELATED APPLICATIONS

This application is a continuation of U.S. application Ser. No. 18/297,216, filed Apr. 7, 2023, now U.S. Pat. No. 12,026,796, which is a continuation of U.S. application Ser. No. 17/402,376, filed Aug. 13, 2021, now U.S. Pat. No. 11,651,466, which is a continuation of U.S. application Ser. No. 16/945,319, filed Jul. 31, 2020, now U.S. Pat. No. 11,127,102, which claims priority to U.S. Provisional Application No. 62/881,624, filed Aug. 1, 2019, all of which are incorporated herein in their entirety by this reference.

TECHNICAL FIELD

This invention relates generally to evaluation of hardware systems, and more specifically to a new and useful system and method for describing, simulating, and/or optimizing spaceborne hardware systems.

BACKGROUND

Spacecraft are typically custom designed for single use cases where the selected payloads drive the system design.

BRIEF DESCRIPTION OF THE FIGURES

FIG. 6B is a representation of exemplary mission definition data, in accordance with embodiments.

FIG. 6C is a representation of exemplary rideshare mission definition data, in accordance with embodiments.

DESCRIPTION OF THE PREFERRED EMBODIMENTS

Figure 1A:
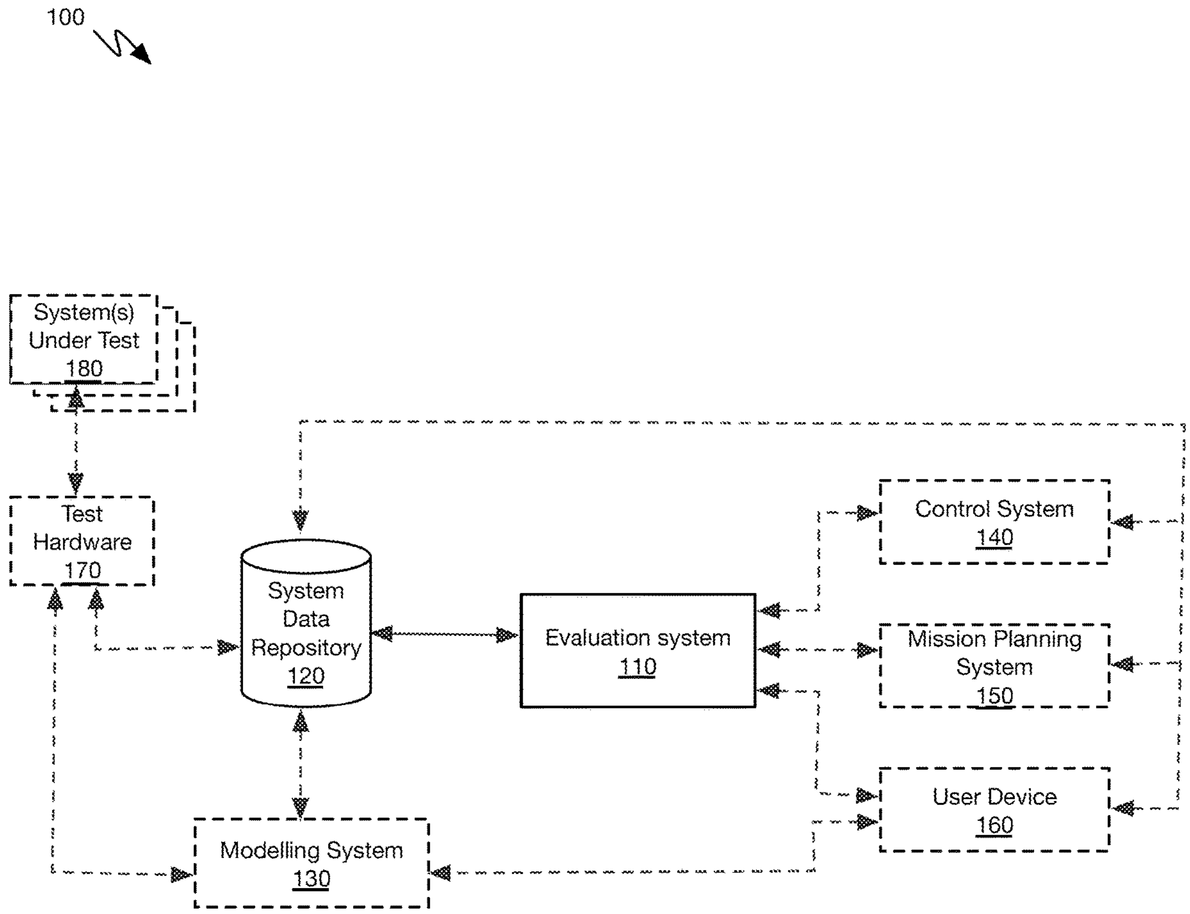
FIGS. 1A-C are schematic representations of systems, in accordance with embodiments.

The following description of the preferred embodiments is not intended to limit the disclosure to these preferred embodiments, but rather to enable any person skilled in the art to make and use such embodiments.

1. Overview

The system and method function to describe, simulate and/or optimize hardware system configurations based on various requirements. In variants, the system and method function to facilitate planning of rideshare missions by selecting system configurations for rideshare systems.

The method can include accessing system data, generating system configuration based on the system data, generating simulation output for the system configuration, and validating the system configuration based on the simulation output (and optionally based on one or more requirements). This process can be performed repeatedly (e.g., continuously, periodically, in response to a command or trigger, etc.) to validate several system configurations. The method can optionally include storing artefacts generated for validated system configurations. In variants, the method includes evaluating validated system configurations. System configurations can be validated continuously, and added to a set of validated system configurations. The evaluation process can be updated to consider newly validated system configurations during the evaluation process. The evaluation process can be performed to select a system configuration for a payload rideshare mission.

System configurations can be spacecraft system configurations that include one or more of a payload, a payload hub, and a spacecraft platform (e.g., a satellite bus bus). Generating system configuration can include selecting at least one payload for a rideshare mission, and optionally selecting a spacecraft platform (e.g., a satellite bus). In some implementations, the spacecraft platform used for a spacecraft system configuration is a fixed-designed satellite bus that is readily-available (e.g., "off the shelf"), and that has not been designed based on requirements for a rideshare mission. For example, the satellite bus can be a low-orbit telecommunication satellite bus readily available from a satellite manufacturer. The system and method disclosed herein evaluate feasibility a system configuration that repurposes the fixed-design satellite bus for a rideshare mission without changing the design of the satellite bus.

2. Benefits

Variations of this technology can afford several benefits and/or advantages.

First, simulating various system configurations, configurations can be validated based on performance level metrics. In this manner, end-user performance level can be evaluated for various system configurations. By virtue of the systems and methods disclosed herein, a user can rapidly generate insight into the level of spacecraft performance that can be guaranteed to a rideshare customer. System evaluation can be performed that either confirms that a specifically required level of service can be provided by the rideshare mission to an individual customer or highlight what level of service can be offered. Evaluation can also ensure that the performance of signing a new payload to a rideshare mission will not infringe upon the performance level committed to other customers already assigned to the rideshare mission. By analyzing the performance and resources available to payloads, the systems and methods disclosed hearing can provide insight into the maximum number of payloads that can be added to any mission without affecting service levels. In this manner, system configuration can be optimized e.g., to maximize revenue of a rideshare mission can be maximized, minimize cost of a multi-satellite constellation, etc.

Second, in-orbit hardware utilization can be improved by validating that a system configuration can continue to operate within defined constraints as additional payloads are added to the system. This capability allows a spacecraft system to host as many payloads as possible while maintaining performance for rideshare customers. Various criteria for optimization can be used to analyze potential rideshare missions. For example, the analysis of rideshare mission candidates can be optimized to: place a focus on the lowest possible mass to lower launch costs, maximize ground station contact to lower payload data latency, maximize re-usability of existing payloads by timesharing them, and the like.

Third, by evaluating system configurations that enable rideshare missions, ride-share mission systems engineering can be improved and development schedules of ride-share missions can be accelerated. The early phase system configuration, mission design, modelling, simulation and concept validation capabilities performed through use of the systems and methods disclosed herein can generate a variety of artefacts and data. These artefacts and data provide a foundation for the systems engineering of a payload rideshare mission concept. The payload specifications and requirements modelled and stored for use in a system data repository can be used to form the basis of the requirement specification once a system configuration has been selected for a given payload rideshare mission. A system configuration that has been simulated and validated to meet the individual payload end user needs can be used as the operational concept for the rideshare spacecraft. A system configuration validated by generating simulation data can also be used to derive further functional requirements for the spacecraft. Additionally, the system configuration can be used as a basis for individual functional tests done during the spacecraft test campaign. Operational scenarios derived from the simulation data generated for a system configuration can be used as a basis for functional and end to end testing to ensure the final spacecraft is able to perform the mission as intended. A mission profile created from a simulation can also be used to provide input conditions and commands for the functional testing of individual payloads before they are integrated into the spacecraft. For example, if the system configuration has a payload operating immediately after the spacecraft emerges from eclipse, this can serve as an input to thermal vacuum testing to ensure the payload is able to operate when the spacecraft has just emerged from a cold state. Furthermore, once the requirements and specifications of an individual payload have been modelled, these modelled elements can be reused to assess future potential rideshare missions that utilize the same payload. This can serve as the basis to design constellations of rideshare spacecraft.

Further benefits are provided by the system and method disclosed herein.

3. System

Various systems are disclosed herein.

In variants, the system functions to evaluate hardware system configurations based on various requirements. In some variations, the hardware system configurations are configurations for spaceborne systems. However, in some variants, the system configurations can relate to any suitable type of hardware system.

In an example, the configurations are configurations of spaceborne systems that are used for payload rideshare missions (e.g., orbital missions that orbit a terrestrial body, e.g., a moon, planet, etc.). A spaceborne payload rideshare mission is a spaceborne mission in which different spaceborne missions share a single spaceborne system (e.g., a satellite, spacecraft, etc.). Separate missions can share common payload, or use dedicated payload that is included on the same spaceborne system. Missions can be operated by (or operated on behalf of) different entities (e.g., customers, government agencies, etc.).

Example orbital payload rideshare missions can include missions for sampling and analysis of the radio-frequency (RF) spectrum for commercial and security applications, weather sensing (using one or more weather sensors), imaging missions, or any other suitable type of mission.

In some implementations, at least one spaceborne system includes a spacecraft platform (e.g., a satellite bus), and optionally one or more payloads.

In some implementations, the spacecraft platform includes at least one power source and at least one communication system. The payloads can share a power source and a communication system of the spacecraft platform during the payload rideshare mission. In an example, the payload coupled to the spacecraft platform can travel with the spacecraft platform along an orbital path. Payloads can be coupled to power sources and communication systems of the spacecraft platform directly, or via one or more payload hubs.

In variants, a spaceborne system includes a payload hub that functions as an interface between a spacecraft platform and one or more payloads. The hub can provide a communication interface (and control interface) for receiving commands from a control system (e.g., a terrestrial control system, a spaceborne control system, etc.). In variants, spaceborne systems are implemented and controlled as described in U.S. Patent Application No. 2020/0039665, filed 23 Jul. 2019, the contents of which is hereby incorporated by reference. U.S. Patent Application No. 2020/0039665 describes a payload hub, spacecraft platform, and payloads, in accordance with variants.

Figure 1B:
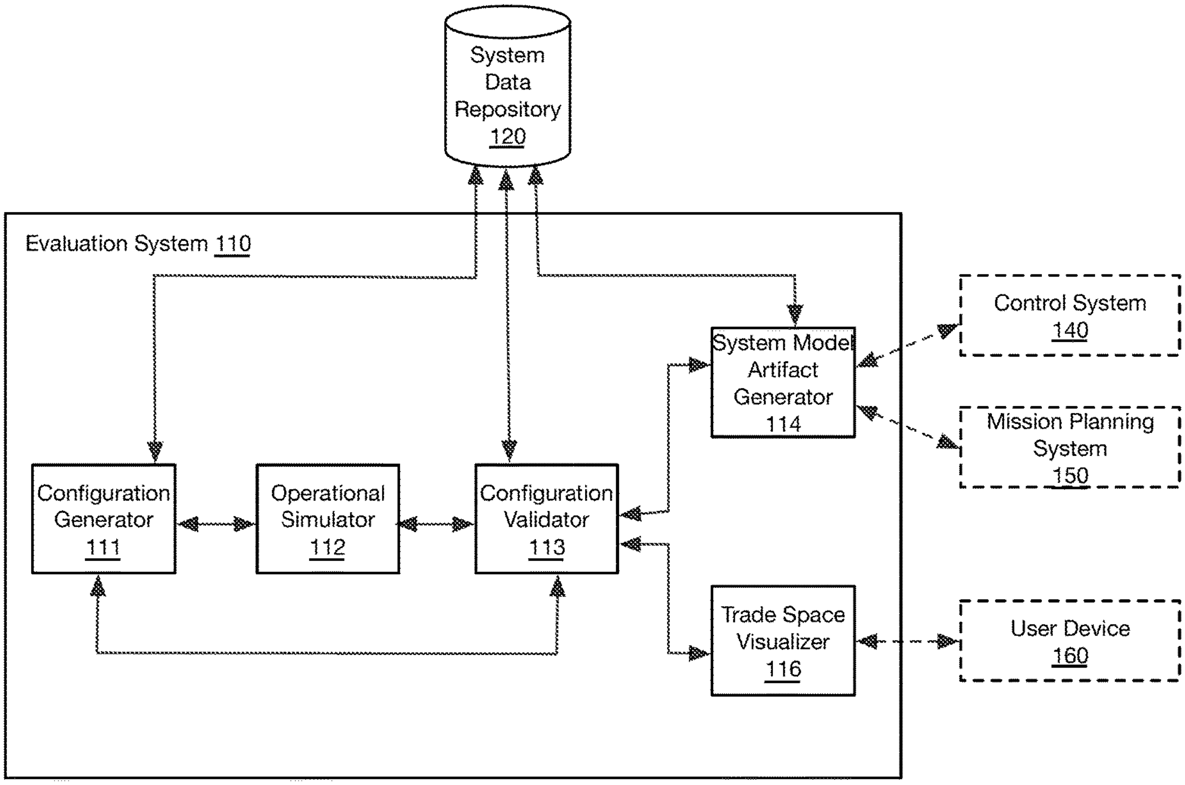
Figure 1C:
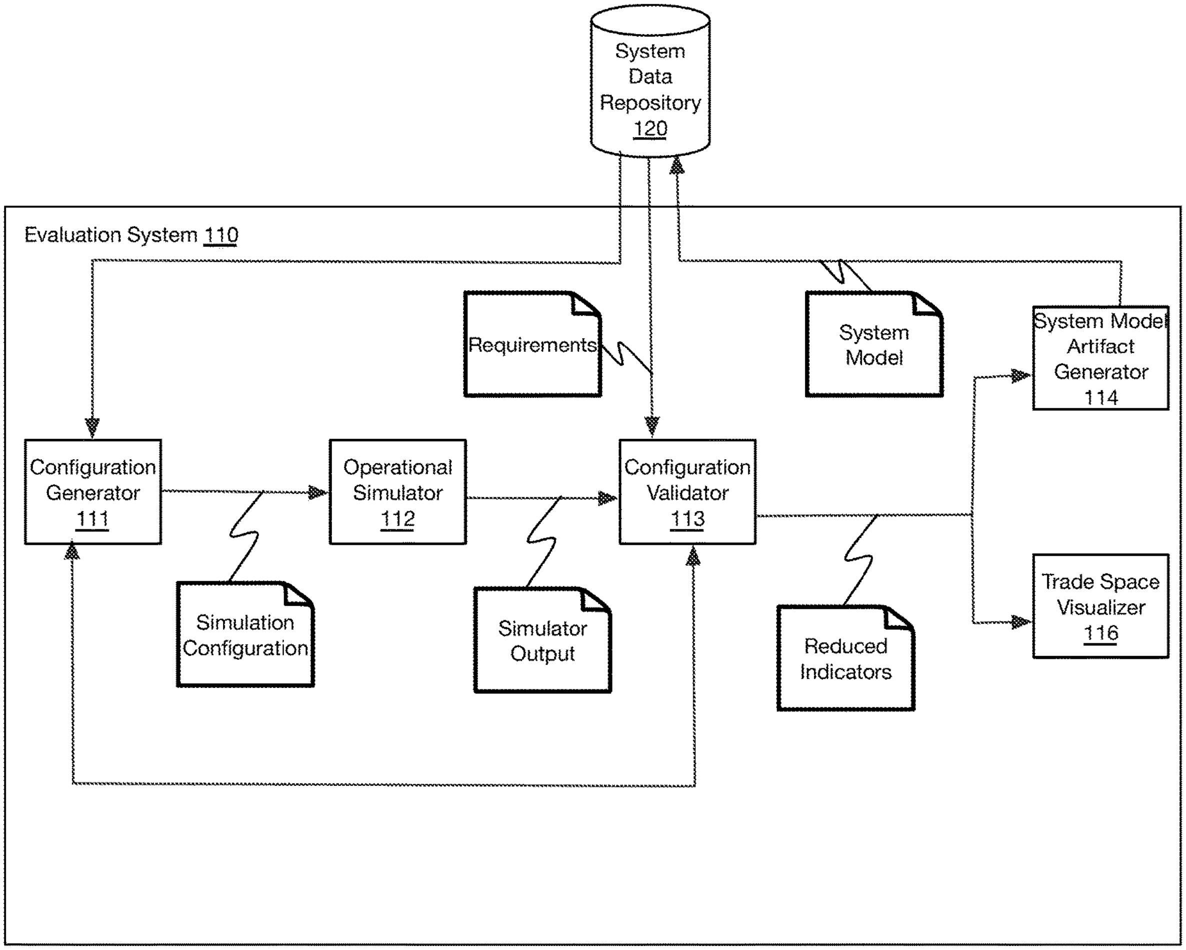

FIGS. 1A-C show exemplary systems 100 in accordance with variations.

The system can be a local (e.g., on-premises) system, a cloud-based system, or any combination of local and cloud-based systems. The system can be a single-tenant system, a multi-tenant system, or a combination of single-tenant and multi-tenant components.

In some variations, the system 100 includes one or more of an evaluation system 110 and a system data repository 120. The system 100 can optionally include one or more of a modeling system 130, a control system 140, a mission planning system 150, a user device 160 (e.g., a laptop, desktop, mobile device, etc.), test hardware 170, and a system under test 180. In some implementations, one or more components of the system 100 can be coupled (e.g., electrically, communicatively, etc.) as shown in one or more of FIGS. 1A-C.

In variants, the evaluation system 110 is a hardware configuration evaluation system.

The evaluation system 110 functions to generate information (e.g., artefacts) that can be used to evaluate one or more system configurations for hardware systems (e.g., spaceborne systems). Such information can identify whether a system configuration satisfies requirements, and can be used to explore trades between different configurations based criteria (e.g., cost, duty cycle, power budget, mass budget etc.), or used in any suitable manner. In some variations, the evaluation system 110 is implemented as software tool (e.g., the OPTIMIX software tool provided by Loft Orbital Solutions, Inc.), however, the evaluation system 110 can be otherwise implemented (e.g., as a hardware system, software system, or combination of hardware and software).

In some implementations, the evaluation system 110 functions to validate one or more system configurations. In variants, system configurations include spacecraft configurations. In some implementations, spacecraft configurations include one or more of a payload, a payload hub, and a spacecraft platform (e.g., a satellite bus bus). For example, the evaluation system 110 can allow a spacecraft operator, manufacturer or service provider to assess the viability of various system configurations. The evaluation system 110 can generate system configurations (e.g., by combining potential payloads with a minimally modified 'off the shelf' satellite bus designs) and then assess and validate these system configurations using modelling and simulation (e.g., to provide automated trade studies). In an example, the various system configurations (e.g., combinations of payloads and satellite bus), and their performance in a simulated mission, are compared to analyze the use of spacecraft resources over the mission lifetime. The evaluation system 110 can run an evaluation process continuously and automatically to provide an ongoing visualization of the performance of validated system configurations as more potential system configurations (e.g., configurations of bus and payload candidates) are added or updated to a data repository (e.g., 120 shown in FIGS. 1A-C). The operational simulation of the ultimately selected payload configuration can then then be used as an initial Concept of Operations (CONOPS) for a spacecraft system.

In variants, the evaluation system 110 functions to facilitate the development of payload rideshare missions using minimally modified off-the-shelf spacecraft systems (e.g., satellite buses). In some variations, the evaluation system 110 identifies system configurations (e.g., spacecraft configurations) that satisfy requirements for a payload rideshare mission. System configurations can be validated based on requirements of a rideshare mission by analyzing a range of performance aspects for one or more system configurations. Rather than designing a spacecraft to support a rideshare mission, the evaluation system 110 enables selection of an existing spacecraft for the rideshare mission.

In some implementations, the evaluation system 110 can use information for each spacecraft platform stored in a system data repository 120, and identify the performance metrics and available resources of a candidate spacecraft platform. Such performance metrics and resources can include: volume, mass, maximum payload volume, maximum payload mass, communications bandwidth, peak and average power and thermal management available to payloads as well as the pointing accuracy, lifetime, electromagnetic compatibility of the spacecraft platform, slew rate, data storage capacity, power available, battery maximal depth of discharge, pointing budget available, and any other suitable metric or resource. However, the evaluation system 110 can identify any suitable performance metric or resource.

In variants, the evaluation system 110 considers the requirements of the individual payloads, including their need for spacecraft platform real estate, resources and operational performance, in addition to any constraints the payload spacecraft platform may have.

The evaluation system 110 can continuously generate a complete set of payloads from a library of candidates, given one or several available platforms or if an agreement has already been made to host a specific payload, the evaluation system 110 can analyze what payloads could be used to fill remaining spacecraft platforms capacity and reduce the cost to all customers.

In variants, the evaluation system 110 aids in the development of potential payload rideshare missions beyond analyzing the configuration viability and system performance. The evaluation system 110 can enable an estimate of overall mission cost and schedule for potential configurations based on use and performance and inform how pricing can be broken down amongst the individual customers of a payload rideshare mission. The outputs of the evaluation system 110 can also inform the negotiation of service level and performance to be provided to customers is also able to aid in the development of a potential rideshare mission beyond analyzing the configuration viability and system performance.

In some variations, the evaluation system 110 includes one or more of: a configuration generator 111, an operational simulator 112, a configuration validator 113, a system model artefact generator 114, and a trade space visualizer 116. However, the evaluation system 110 can include any suitable components that enable the evaluation system 110 to perform at least a portion of the method described herein.

In some variations, the modelling system 130 provides a graphical user interface which allows a user (e.g., via a user device 160, shown in FIG. 1A) to access a programming environment and tools such as R or python, and contains libraries and tools which allow the operator to prepare, build, train, verify, and publish models (e.g., models that predict performance values for components of a spacecraft system configuration). In some variations, the model development system 130 provides a graphical user interface which allows a user (e.g., via 160) to access a model development workflow that guides an operations user through the process of creating and analyzing a predictive model.

The system data repository 120 can be any suitable type of data repository. The repository 120 can be implemented using any suitable type of storage device (or combination of several storage devices). The repository can be an on-premises storage device, or a cloud-based storage device (e.g., included in a single or multi-tenant cloud-based storage platform).

Figure 4A:
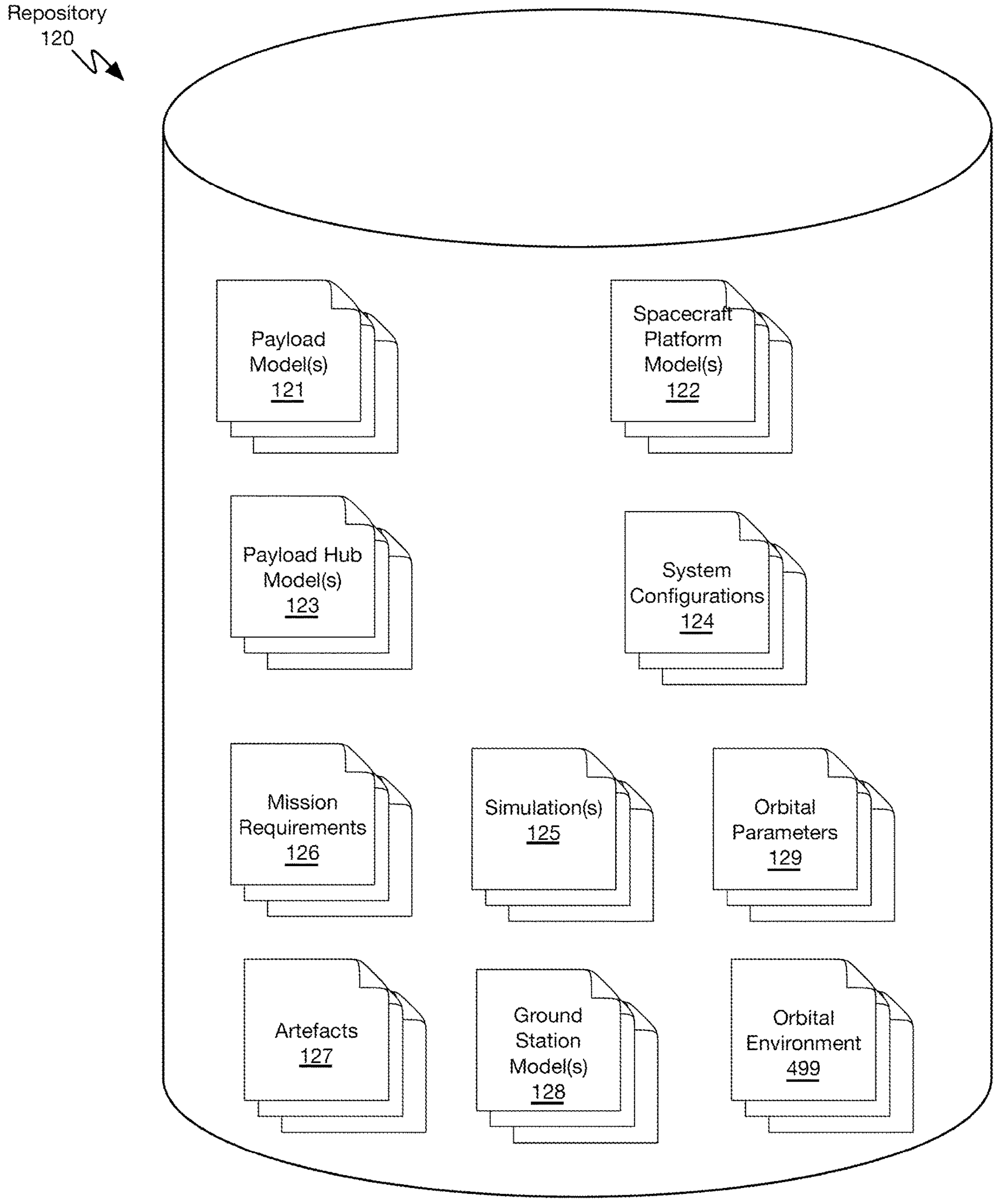
FIGS. 4A-D are schematic representations of data stored in a repository, in accordance with embodiments.

In variants, the repository 120 stores data for one or more of: a payload model 121, spacecraft platform model 122, a payload hub model 123, a system configuration 124, mission requirements 126, a simulation 125, artefacts 127, ground station model 128, and orbital parameters 129, as shown in FIG. 4A.

Figure 4B:
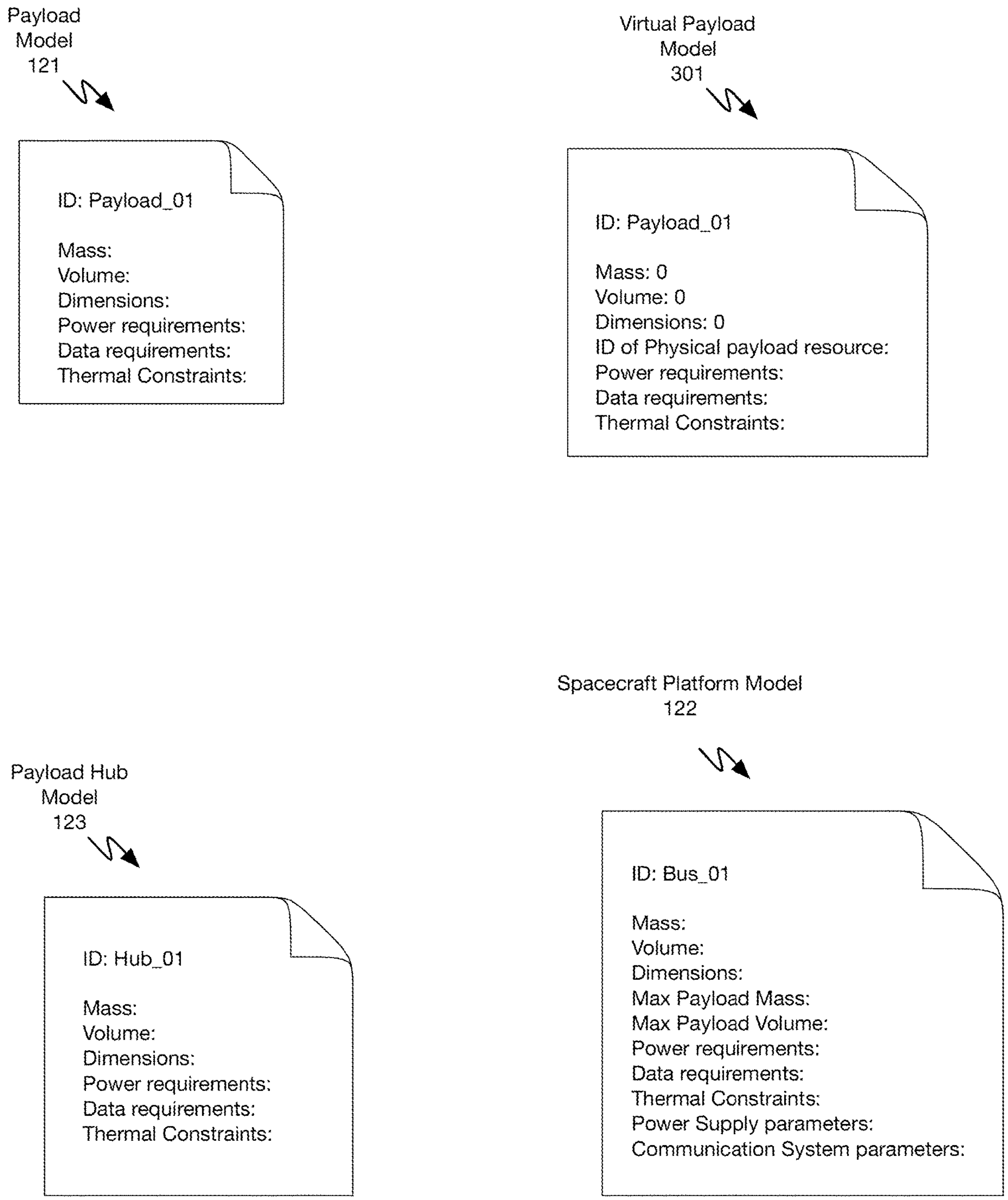

In variants, data for models (e.g., 121, 122, 123) includes one or more of: characteristics (e.g., values that are known and don't change), parameters (e.g., unknown values, estimated values, values identified during model execution, etc.), state variables, control variables, and environment variables, as shown in FIG. 4B. However, any suitable type of data can be included in a model. Models (e.g., 121, 122, 123) can include predictive models that predict values for one or more parameters of a component of a spacecraft system based on a set of model inputs (e.g., control values, environment values, etc.).

In an example, data for a ground station model 128 includes one or more of: coordinates of the ground station, maximum bandwidth offered at the ground station, and the like.

In an example, data for a spacecraft platform model 122 includes one or more of spacecraft platform constraints and characteristics. Spacecraft platform constraints and characteristic can include one or more of: volume, mass, maximum payload volume, maximum payload mass, communications bandwidth, peak and average power and thermal management available to payloads as well as the pointing accuracy, lifetime, electromagnetic compatibility of the spacecraft platform, slew rate, data storage capacity, power available, battery maximal depth of discharge, pointing budget available, and any other suitable metric or resource. However, spacecraft platform model 121 can identify any suitable platform constraints and characteristics.

In an example, data for a payload model 121 includes requirements of an individual payload. Requirements of an individual payload can include one or more of stability (e.g., maximum jitter), acceptable timeline to launch date, heat generation, thermal control, electro-magnetic interfaces (maximum acceptable signal to noise ratio), instant power draw, minimum surface of unobstructed nadir facing side, operating lifetime, geographical area of interest (e.g., defined cones during which the payload needs to be turned on), data volume generated, maximum stress value during launch sequence (e.g., maximum acceleration and vibration levels). However, a payload model 121 can identify any suitable requirements.

Figure 4C:
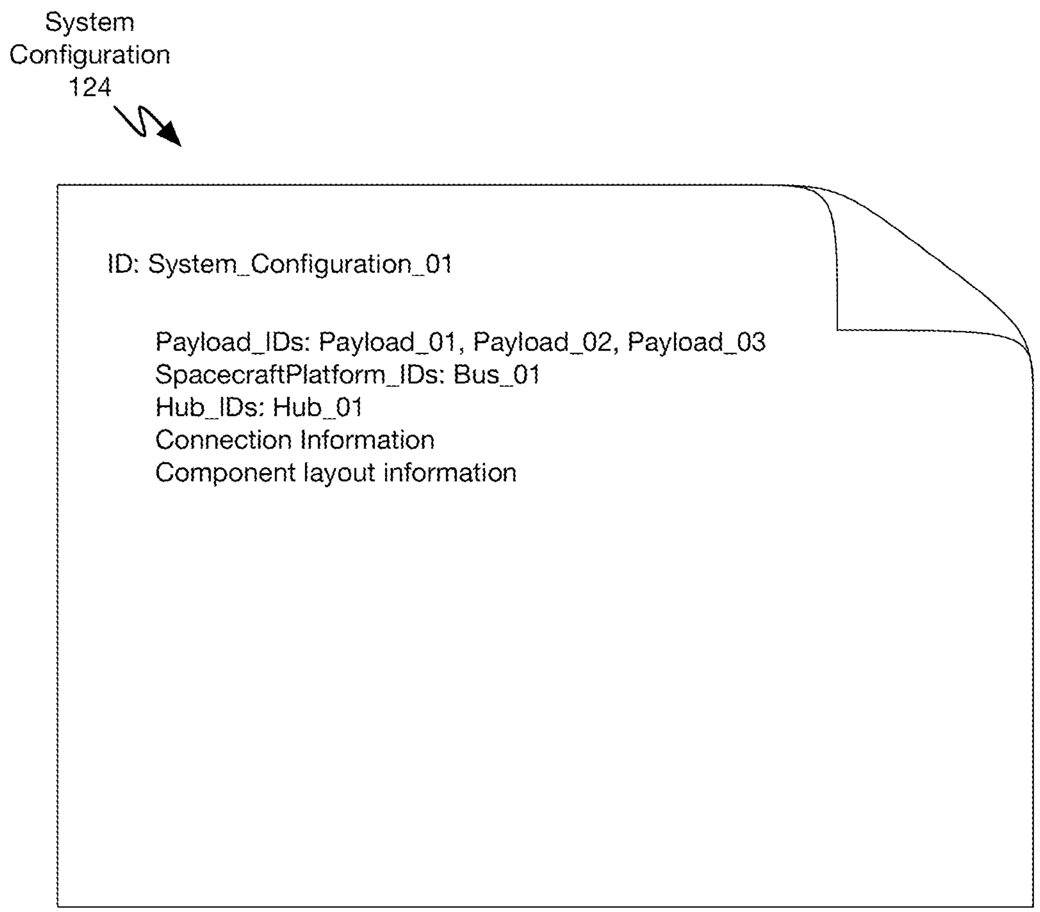

In variants, data for a system configuration 124 includes one or more of: characteristics, parameters, state variables, control variables, and environment variables. In variants, characteristics identify one or more of: a payload, spacecraft platform, a payload hub, connection information (that describes interconnections among components of the configured system), and component layout information (that identifies physical arrangement of system components within the system being configured). FIG. 4C shows example system configuration data 124. However, any suitable type of data can be included in a system configuration.

Figure 4D:
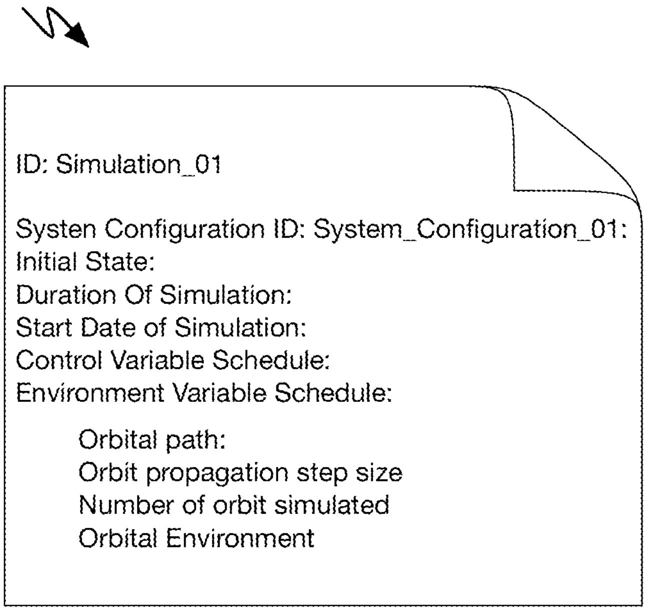

In variants, data for a simulation 125 identifies one or more of: a system configuration being simulated, an initial state, orbital parameters, orbital environment, duration of simulation, start date of simulation, orbit propagation step size, number or orbits simulated, orbital path, a control variable schedule, and an environment variable schedule. In some implementations, the control variable schedule identifies control instructions to be used in the simulation, and optionally timing or order of execution for the control instructions. In some implementations, the environment variable schedule identifies environment variable values to be used control the simulation environment during the simulation, and optionally timing or order of processing of the environment variable values. In variants, one or more of a control variable schedule and an environment variable schedule are generated based on the attributes of the system configuration being simulated, and based on orbital parameters for the simulation. FIG. 4D shows example simulation data 125.

In variants, orbital parameters 129 represent a type of orbit (Sun Synchronous, Equatorial, Polar, etc.), altitude, inclination, eccentricity, longitude of the ascending node. Orbital environment 499 defines an orbital environment for at least one orbital path used in a simulation.

Figure 5A:
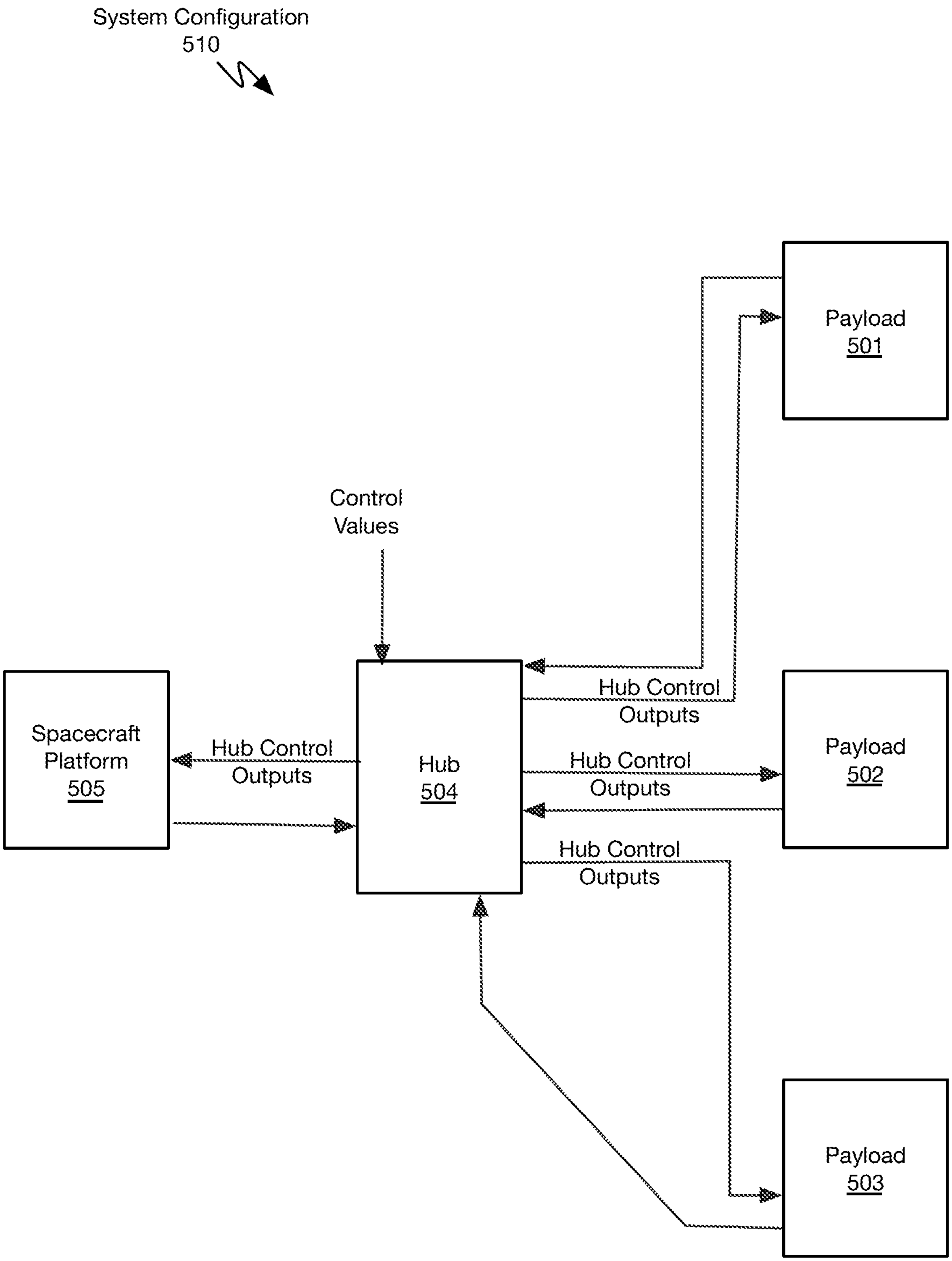
FIGS. 5A-B are schematic representations of system configurations, in accordance with embodiments.

A spacecraft system represented by system configuration 124 preferably includes a set of payloads (e.g., 501-503 shown in FIGS. 5A-B) and optionally a payload hub (e.g., 504 shown in FIG. 5A). In variants, each spacecraft system includes one or more payloads (e.g., customer-specific payloads, such as payloads associated with a customer of a spacecraft-based services company controlling the system and/or elements thereof; generic payloads, such as payloads configured for general use by multiple customers; etc.), each connected (preferably mechanically, electrically, and communicatively) to a payload hub. Customer-specific payloads (e.g., payloads configured, provided, owned, leased, and/or otherwise controlled by a customer, payloads otherwise associated with the customer, etc.) can be provided by the customer, by the spacecraft-based services company, and/or by any other suitable entities. However, the spacecraft systems can additionally or alternatively include any other suitable elements in any suitable arrangement.

Some examples of payloads can include one or more sensors. The sensors preferably include imaging sensors (e.g., cameras, synthetic-aperture radar sensors, etc.), but can additionally or alternatively include any other suitable sensors. The payload can optionally include actuators configured to aim and/or otherwise adjust operation of the sensor (e.g., reposition the sensor, adjust elements of the sensor such as apertures, shutters, filters such as spectral filters and/or polarization filters, etc.), and/or can include any other suitable elements configured to control sensor operation and/or state. One or more payloads can additionally or alternatively include propulsion elements. One or more payloads can additionally or alternatively include experimental elements, such as electronic elements (e.g., experimental flight computer, experimental circuitry, control electronics for conducting experiments, etc.).

Each payload can additionally or alternatively include communication elements (e.g., configured to communicate with the payload hub, configured to communicate with terrestrial elements such as one or more ground control elements, etc.), such as radio frequency communication elements (e.g., RF transmitters and/or receivers), optical communication elements (e.g., laser communication elements), and/or quantum-based communication elements. Each payload can additionally or alternatively include computation elements (e.g., configured to control sensor and/or communication element operation; configured to process data sampled by the sensors and/or received by the communication elements; configured to process commands such as commands received from the hub, from terrestrial elements such as ground control elements, etc.; and/or configured to perform any other suitable functions). In some embodiments, one or more payloads is a software-only payload, such as one or more software modules executing (and/or configured to be executed) on computation elements of the payload and/or the payload hub. The payloads can additionally or alternatively include one or more: radio frequency sensors (e.g., radios, antennas, etc.), weather monitoring instruments, climate monitoring instruments, scientific instruments (e.g., astrophysics instruments), cameras (e.g., optical, IR, hyperspectral, multispectral, etc.), radar instruments, Internet of Things transmitters, computers and/or computer circuitry, FPGAs, electronics modules, technology demonstration experiments, and/or any other suitable payload elements.

The payloads preferably do not include elements configured to control (and/or otherwise alter) spacecraft system attitude and/or trajectory. In variants in which one or more payloads do include spacecraft system attitude and/or trajectory control elements, operation of such elements is preferably mediated by (e.g., controlled exclusively by and/or with authorization from, controlled within limits set by, etc.) the payload hub and/or ground control elements. However, one or more payloads can additionally or alternatively include one or more payload-controlled spacecraft system attitude and/or trajectory control elements.

Each payload is preferably restricted to remain within a specific volume (e.g., defined relative to the payload hub) allotted to the payload. For example, the payload can be restricted to remain within the volume at all times, or at all times except when authorized (e.g., by the payload hub and/or ground control elements) to extend outside the volume. However, the payloads can alternatively occupy any other suitable volumes.

However, each payload can additionally or alternatively include any other suitable elements in any suitable configuration. Each payload can optionally be associated with (e.g., assigned to, configured by, controlled by, owned by, provided by, etc.) one or more users or other entities. However, some or all of the payloads can alternatively be generic payloads (e.g., available to all users, or to all users qualified to access payloads of that type, and/or can be otherwise assigned). The generic payloads can include standard payloads (e.g., previously designed for and/or flown on other spacecraft, available as standard designs, available commercially off-the-shelf, etc.), customized payloads (e.g., customized, such as by a customer or spacecraft-based services company, for use in the system), and/or any other suitable payloads.

The payload hub preferably functions to control spacecraft operation and/or coordinate operation of the payloads. In a first variation, the payload hub includes a spacecraft platform.

In a second variation, the payload hub includes an interface module (or multiple interface modules) that function to interface one or more payloads with a spacecraft platform (e.g., by coupling a payload to a power system or communication system of the spacecraft platform). In the second variation, in which the payload hub includes an interface module, the interface module preferably functions as an interface (e.g., communication interface, mechanical interface, and/or electrical interface, etc.) between other elements of the spacecraft platform (e.g., between the bus and one or more of the payloads); and/or preferably functions as an interface (e.g., communication interface) between the spacecraft platform and/or other payloads, and optionally other elements, such as ground control elements, other spacecraft, etc. In such variations, the interface module can function to facilitate use of arbitrary payloads, buses, and/or payload-bus combinations in a spacecraft. In examples in which the interface module is engineered to interface with both the bus and the payloads, the bus does not need to be engineered based on specific characteristics of the payloads and/or of the interface module. In examples in which the interface module is further engineered to interface with the ground control elements (e.g., wherein the interface module is configured to communicate with the ground control elements in a standardized manner), preferably such that any communication between ground control elements and other elements of the spacecraft system is intermediated via the interface element, the other spacecraft elements (e.g., bus, payloads) on the one hand and the ground control elements on the other hand do not need to be engineered based on specific characteristics of each other.

In variants, the hub (e.g., the interface module) is connected to each payload, more preferably mechanically, communicatively, and electrically connected, but can alternatively have any other suitable arrangement and/or configuration with respect to the payloads. In variants, the hub (e.g., the bus and/or the interface module) includes one or more power sources, attitude and/or trajectory control modules, astrionics modules (e.g., attitude determination sensors, command modules, telemetry modules, health sensors, etc.), avionics modules, communication modules, computation modules, sensors, and/or any other suitable elements. In some examples, the spacecraft platform includes one or more power sources, attitude and/or trajectory control modules, and astrionics modules (e.g., attitude determination sensors, command modules, telemetry modules, health sensors, etc.), and the interface module includes one or more communication modules and computation modules included in the spacecraft platform. However, the elements of the hub can additionally or alternatively be distributed in any other suitable manner.

In variants, the hub functions to measure and/or control spacecraft operation, such as by measuring and/or controlling spacecraft attitude and/or trajectory. In some examples, the hub (and/or any other suitable elements of the spacecraft system) can include one or more astrionics modules (sun sensors, star trackers, magnetometers, Earth horizon sensors, global navigation satellite system receivers, etc.). For example, the hub can include attitude control mechanisms (e.g., reaction wheels, thrusters, control moment gyroscopes, etc.) and/or trajectory control mechanisms (e.g., propulsive devices), such as trajectory control mechanisms used for orbital station-keeping and/or orbit alteration.

In variants, the hub controls spacecraft communication with the ground control elements (e.g., wherein all terrestrial communication is performed via the hub, wherein the hub authorizes communication with any terrestrial elements, wherein the hub communicates with the ground control elements). For example, the hub can include one or more wireless communication modules, such as those configured to communicate (e.g., transmit and/or receive) using the X band, Ka band, UHF band, and/or any other suitable frequencies. However, communication modules of the payloads may additionally or alternatively communicate with the ground control elements, other terrestrial elements, and/or any other suitable elements.

In variants, the hub controls spacecraft power generation (e.g., wherein the hub controls power generation module operation, such as by deploying, aiming, and/or stowing solar power harvesting elements such as solar cells) and/or provision (e.g., wherein the hub allots, budgets, and/or dispenses power to other elements of the spacecraft, such as to the payloads). However, the hub can additionally or alternatively include any other elements in any suitable configuration and/or can perform any other suitable functions.

In variants, the spacecraft platform can include one or more of the components described herein for the hub, and perform at least a portion of one or more of the functions described herein for the hub.

In some variations, the components of the system can be arranged in any suitable fashion.

In some variations, one or more of the components of the system 100 (e.g., the evaluation system 110, repository 120, modelling system 130, control system 140, mission planning system 150, user device 160, test hardware 170, etc.) are implemented as a hardware device that includes one or more of a processor (e.g., a CPU (central processing unit), GPU (graphics processing unit), NPU (neural processing unit), etc.), a memory, a storage device, an input device, an output device, and a communication interface. In some implementations, a component of the system 110 (e.g., the evaluation system 110, repository 120, modelling system 130, control system 140, mission planning system 150, user device 160, test hardware 170, etc.) can include a display device. In some implementations, a component of the system 110 (e.g., the evaluation system 110, repository 120, modelling system 130, control system 140, mission planning system 150, user device 160, test hardware 170, etc.) can include an audible output device. In some variations, one or more components included in hardware device are communicatively coupled via a computing system bus. In some variations, one or more components included in the hardware system are communicatively coupled to an external system via the communication interface.

The communication interface functions to communicate data between the hardware system and another device via a network (e.g., a private network, a public network, the Internet, and the like).

In some variations, the storage device includes the machine-executable instructions for performing at least a portion of the method 200 described herein.

In some variations, the storage device includes data stored in the repository 120.

The input device functions to receive user input. In some variations, the input device includes at least one of buttons and a touch screen input device (e.g., a capacitive touch input device).

4. Method

The method can function to evaluate hardware system configurations based on various requirements.

In an example, the method functions to select a feasible spacecraft system configuration for a spacecraft (e.g., satellite) payload rideshare mission (from among various available spacecraft system configurations). System configurations can include a spacecraft platform (e.g., a satellite bus) and one or more payloads. Payloads can be directly coupled to the spacecraft platform, or indirectly coupled to the spacecraft platform via one or more payload hubs (e.g., a payload hub described in U.S. Patent Application No. 2020/0039665). The available spacecraft system configurations can include pre-designed (off the shelf) satellite busses, and the method can select an existing bus design for use, thereby enabling use of low-cost satellite busses as opposed to requiring a custom-designed satellite bus for the mission. Payloads can be shared among several ride-share customers (tenants), or dedicated to one or more ride share customers. System configurations can include multi-tenant configurations that can support missions for one or more tenants (e.g., customers). System configurations can include components (e.g., a payload hub) that provide a standardized control interface (e.g., a command set, application programming interface, etc.) that can be used to control any controllable component of the satellite system (e.g., the hub, a payload, etc.). The control interface can be a multi-tenant interface that provides each tenant (customer) control of payloads, and the interface can perform authentication and authorization to restrict a tenant to control of a set of spacecraft system components (based on permissions assigned to the tenant). However, control of spacecraft systems can otherwise be provided.

In variants, selection of a feasible spacecraft system configuration for a satellite payload rideshare mission can include selection of a spacecraft system that can perform a plurality of missions simultaneously (e.g., for a single tenant, or several tenants) while satisfying requirements (and service level agreements) for each mission. For example, the method can validate that simultaneous operation of payloads for different missions satisfies system resource constraints (e.g., one mission doesn't consume too much power, negatively impacting another mission), thermal constraints (e.g., a payload for a first mission doesn't cause a payload for a second mission to overheat), etc.

However, the method can evaluate any suitable type of hardware system configurations based on any suitable set of requirements.

The method can evaluate systems by modeling system components, running mission simulations by using the models, and using simulation outputs to evaluate suitability of one or more systems for an intended purpose (e.g., mission).

FIGS. 2A-C and 3 are representations of a method 200, according to variations. In some variations, at least one component of the system 100 performs at least a portion of the method 200.

In variants, the method includes one or more of: accessing system data S210, generating at least one system configuration based on the system data S220, generating simulation output for at least one system configuration S230, and validating at least one system configuration based on the simulation output (and optionally based on one or more requirements) S240. At least a portion of the method can be performed repeatedly (e.g., S210-S240, S210-S250, S220-S240, S220-S250) (e.g., continuously, periodically, in response to a command or trigger, etc.) to validate several system configurations. The method can optionally include storing artefacts generated for validated system configurations S250. In variants, the method includes evaluating validated system configurations S260 (e.g., to select a system configuration that is optimal based on evaluation criteria). System configurations can be validated (e.g., at S240) continuously, and added to a set of validated system configurations. For example, additional system configurations can be automatically generated and validated to accommodate the addition of new missions (e.g., client-specific sub-missions) to a scheduled space launch (e.g., missions added in response to customer requests, etc.). The evaluation process (e.g., 260) can be updated to consider newly validated system configurations during the evaluation process. The evaluation process S260 can be performed to select a system configuration for one or more payload rideshare missions.

The method 200 can be repeated (e.g., continuously, periodically, in response to an instruction, in response to detection of a new payload or spacecraft platform model, or in response to any suitable trigger).

Accessing system data S210 can include accessing information used to generate a system configuration at S220. Information accessed at S210 can include accessing data for one or more of: a payload model 121, spacecraft platform model 122, a payload hub model 123, a system configuration 124, mission requirements 126, a simulation 125, artefacts 127, a ground station model 128, and an orbital model 129, as shown in FIG. 4A. In variants, S210 includes generating data (e.g., by using the modeling system 130, test hardware 170, systems under test 180, etc.) for one or more of: a payload model 121, spacecraft platform model 122, a payload hub model 123, a system configuration 124, mission requirements 126, a simulation 125, artefacts 127, a ground station model 128, and an orbital model 129. However, any suitable data can be accessed (or generated) at S210.

Accessing system data S210 can include generating a model in a computer-readable format based on data received from a device manufacturer. For example, a spacecraft platform model can be generated (manually, programmatically, etc.) from technical specification documentation (and optionally test or performance data) provided by a spacecraft platform manufacturer. Similarly, models can be generated for payloads from technical specification documentation (and optionally test or performance data) provided by a payload device manufacturer. Additionally, or alternatively, accessing system data S210 can include generating a model by using test hardware (e.g., 170 shown in FIG. 1A). For example, test hardware can test a system under test 180 (e.g., a payload hub, payload, spacecraft platform, etc.) by applying control or input values to the system 180 being tested (and optionally controlling the environment, e.g., ambient temperature) and measuring outputs (e.g., data generated), heat dissipation, and power consumption.

In variants, each model identifies one or more parameters. In some implementations, payload models, spacecraft platform models, and payload hub models each identify one or more of: power requirements, data communication requirements, thermal constraints (e.g., as shown in FIG. 4B). In some implementations, a model of a physical device identifies at least one of: a mass of the modeled device, a volume of the device, dimensions of the device, a shape of the device (e.g., in a computer aided design format). In some implementations, accessed system data includes one or more virtual models, which do not identify values for mass, volume, or physical dimensions. A virtual model can be used to model use of a hardware resource of a physical device. Such models can identify the physical device (e.g., payload) or component of the physical device (e.g., processor core, image sensor, communication module, etc.) being used by the virtual model. For example, to model a system configuration for a payload rideshare mission that includes a single camera payload that is to be used for several different tenants (customers), a virtual model can be selected to represent power and data requirements for one or more of the individual customer missions.

In some implementations, a model for a device that includes a power source identifies power supply parameters (e.g., max power output, charge capacity, charge rate, voltage ranges, max current, etc.). In some implementations, a model for a device that includes a data communication device identifies data communication parameters (e.g., frequency ranges, max bandwidth, max transmission speed, max transmission power, radio type, antenna type, supported communication protocols, etc.). In some implementations, a model for a device that includes payload space (e.g., a satellite bus or a payload that can accommodate additional payloads) identifies payload space parameters (e.g., maximum payload mass, maximum payload volume, payload space dimensions, payload space shape, etc.).

Accessing system data S210 can include updating system data (e.g., stored in the repository 120). Data can be added to the repository 120 in response to a request for adding a new customer-specific sub-mission to a payload rideshare mission, in response to addition of a new payload that can be used for rideshare missions, and in response to addition of a new spacecraft platform that can be used for rideshare missions. For example, as new payloads and spacecraft platforms are purchased or developed, corresponding models can be added to the repository 120, so that they can be selected for use in a system configuration that will be evaluated.

Data accessed at S210 can be used to generate at least one system configuration at S220. System configuration can be generated automatically or in response to user input. In a first example, system configuration can be automatically generated based on one or more requests for space missions (e.g., a rideshare mission, or a sub-mission to be included in a rideshare mission). In a second example, system configuration can be generated based on a request to update an existing rideshare mission system configuration to include support an additional sub-mission. In a third example, the system configuration can be explicitly configured by a user of a user device (e.g., 160). For example, an operator can request evaluation of a specific system configuration (e.g., regardless of whether the system configuration is suitable for a particular rideshare mission).

In variations, the evaluation system 110 (or a component of the evaluation system, e.g., the configuration generator 111) generates system configuration at S220. However, any suitable component of the system 100 can generate the system configuration at S220. Generating system configuration S220 can include selecting at least one payload for a rideshare mission (S222). In variants, a single spacecraft platform is used for all rideshare missions. Alternatively, a selection of various spacecraft platforms can be used. In variants, generating system configuration S220 can include selecting a spacecraft platform (e.g., a satellite bus) from a plurality of available spacecraft platforms (S221). In some implementations, selecting a spacecraft platform includes selecting a fixed-designed satellite bus. In some implementations, the fixed-designed satellite bus is a readily-available (e.g., "off the shelf") satellite bus that has not been designed based on requirements for a rideshare mission. For example, the selected satellite bus can be a low-orbit telecommunication satellite bus readily available from a satellite manufacturer, and the evaluation system 110 evaluates the feasibility a system configuration that repurposes the satellite bus for a rideshare mission. In variants, generating system configuration S220 preserves the fixed-design of the fixed-design satellite bus.

In variants, a payload bus is used for all rideshare missions. A single type of payload bus can be used for all rideshare missions. Alternatively, several payload busses (each having different designs) can be available for selection, and S220 can include selecting a payload bus.

In variants, selection of components for the system configuration is performed based on requirements for a rideshare mission. Rideshare missions can include several submissions (e.g., for a single tenant, for different tenants, etc.). In some implementations, the requirements for the rideshare mission include requirements for each sub-mission included in the rideshare mission. In variations, mission requirements (e.g., 126) identify one or more of: a payload, a spacecraft platform, a ground station, a launch site, a launch location (e.g., city, state, country, continent, etc.) mission actions, action triggers, action parameters, action schedules, and orbital parameters. However, mission requirements can identify any suitable requirement. In variants, the mission requirements are used to define one or more of a system configuration (e.g., 124), a simulation (e.g., 125), and orbital parameters (e.g., an orbital path).

In some implementations, the system (e.g., the mission planning system 150, user device 160, evaluation system 110) receives sub-mission requirements via one of a user interface, and API (Application Programming Interface) and a network interface. In some implementations, at least one of the user interface and the API is provided by an application server.

In some implementations, the system generates one or more sub-mission requirements based on one or more mission definitions (e.g., received via one or more of user interface, an API, and a network interface).

In some implementations, a mission definition identifies at least one action (or objective) and one or more triggers for each action. A mission definition can optionally define parameters (e.g., data capture quality, data capture format, control values, data capture duration, etc.) for one or more actions. Example actions include data capture, data transmission, payload control, etc. Actions can describe a generic action to be performed (e.g., image capture, data transmission, etc.) or describe an action that involves use of a specific payload (e.g., data capture using an identified methane spectrometer payload, etc.). Actions can describe actions related to a payload provided by a customer associated with the action, or actions related to a payload provided by another entity (e.g., a shared payload, a payload of another customer that is available for use by others). Triggers can include any suitable type of trigger, such as time-based triggers, location based triggers, environment-based triggers (e.g., based on ambient temperature, etc.), system-event triggers (e.g., triggers based on events generated by components of the spaceborne system (or an external system). For example, a customer may request a mission to capture images over Peru every week at 12:00 GMT for 5 hours. Another customer may request a mission to sense methane over the Middle East daily for 5 hrs.

In some implementations, a mission definition includes a payload description for each payload, and optionally a number of payloads to be used for the mission. In some implementations payload description for a payload includes one or more of: a payload name, a payload type, and a current technology readiness, mass, length, width, height, and desired placement (e.g., nadir facing, placement not important, etc.). In some implementations, the mission definition defines one or more operating modes (e.g., imaging mode, processing mode, standby mode, etc.). In some implementations, an operating mode definition for an operating mode identifies one or more of: name, mean power, duty cycle (e.g., average % of orbit), spacecraft pointing desired, maneuvering desired, and area of interest (AOI) (e.g., North America, Polar regions, not important, etc.). In some implementations, the mission definition defines attitude determination and control system (ADCS) information. In some implementations, ADCS information identifies one or more of: pointing accuracy, pointing knowledge, pointing stability, and maximum pointing angle off nadir. In some implementations, the mission definition defines data information. In some implementations, data information identifies one or more of: data volume per orbit, maximum data latency from collection, on-board data processing resources desired, and on-board data storage desired. In some implementations, the mission definition defines orbit information. In some implementations, orbit information identifies one or more of: orbit type, altitude range, inclination, and LTAN (Local Time of Ascending Node). In some implementations, the mission definition defines schedule information. In some implementations, schedule information identifies one or more of: planned flight model readiness, desired launch date, desired mission duration, and payload design life.

Figure 6A:
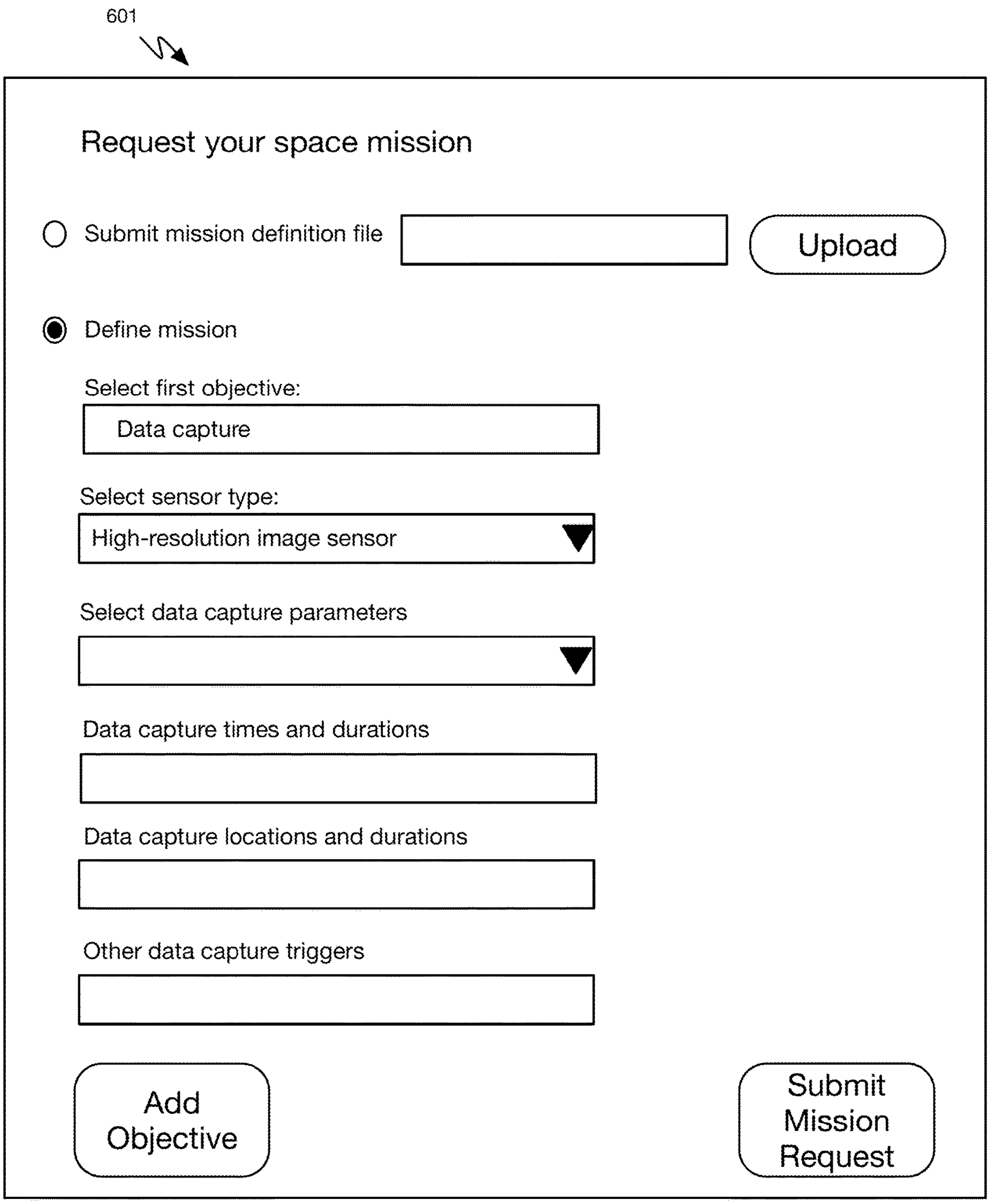
FIG. 6A is a representation of an exemplary user interface, in accordance with embodiments.

In some variations, a mission definition can be defined by a mission definition file that is uploaded via a user interface (e.g., using the "Upload" button shown in FIG. 6A).

FIG. 6A shows an example graphical user interface (GUI) for receiving a mission definition from a user. FIG. 6A is merely an example and in variations, the GUI can include any number and type of GUI elements for receiving any suitable input related to requesting and defining a mission. In some implementations, one or more of the mission planning system 150, user device 160, evaluation system 110 provides the graphical user interface 601 shown in FIG. 6A. FIG. 6B shows an example mission definition data 602. In some implementations, one or more of the mission planning system 150, user device 160, evaluation system 110 receives mission definition data. FIG. 6C shows an example rideshare mission definition data 603 that includes two sub-missions (e.g., Mission ID 1 and Mission ID 2). As shown in FIG. 6C, the rideshare mission data 603 includes missions from two different customers. However, ride share missions can include any number of sub-missions, for any number of customers. In a first example, a first rideshare mission includes several sub-missions for one customer. In a second example, a second rideshare mission includes sub-missions for several customers.

In variants, rideshare mission requirements are stored in the repository 120. In some implementations, rideshare mission requirements (e.g., stored in the repository) area updated as new missions (e.g., client-specific sub-missions) are requested (e.g., via the mission planning system 150).

In variants, selecting a spacecraft platform includes selecting a spacecraft platform that satisfies mission requirements (e.g., 126) for at least one sub-mission. In some implementations, the spacecraft platform is a fully-designed spacecraft platform that is characterized by a spacecraft platform model 122. Because the spacecraft platform design is complete (and optionally tested and validated for space flight), the spacecraft platform model is complete and suitable for running simulations for missions.

In variants, generating system configuration S220 includes identifying a set of payloads (e.g., at S222) that satisfy the mission requirements (e.g., 126) for at least one sub-mission. For example, if a sub-mission requires a methane sensor, then a methane sensor payload is selected.

Once a first set of payloads needed to satisfy all requirements have been selected (at S222), the evaluation system 110 validates (at S223) the selection of payloads to determine whether the selected payloads can be coupled to the same spacecraft platform. In some implementations, the design of the spacecraft platform is fixed, as these spacecraft platforms are intended for use without modifications to the design. Accordingly, the selected payloads should satisfy constraints imposed by the design (fixed design) of the selected spacecraft platform (e.g., fixed design satellite bus). In an example, these spacecraft platforms are "off-the-shelf" systems purchased from a manufacturer, and are used as-is, without any design modification (or any significant design modification), in the interest of reducing cost and reducing time to design a feasible rideshare mission. Constraints imposed by the design of the selected spacecraft platform can include one or more of: a maximum payload mass supported by the spacecraft system, a maximum payload volume that can be accepted by the spacecraft platform, dimensional constraints imposed upon payloads by the spacecraft platform, power constraints (e.g., peak power, average power, etc.) imposed by one or more power supplies included in the spacecraft platform, data communication constraints (e.g., communications bandwidth, etc.) imposed by the communication system(s) included in the spacecraft system, navigational constraints (e.g., pointing accuracy, etc.) imposed by the propulsion system and mechanical design of the spacecraft system, and thermal constraints (e.g., thermal management available to payloads) imposed by the design of the spacecraft system. Other spacecraft platform constraints (or parameters) can include one or more of remaining lifetime of the spacecraft platform, electromagnetic compatibility of the spacecraft platform, and the like.

In variants, unlike some conventional techniques for planning missions using payloads, the design of the spacecraft platform is not changed to accommodate the requirements of the missions. Therefore, if the first set of payloads (selected at S222) does not satisfy the constraints (as determined at S223), then selection of payloads is performed again (S222*b* shown in FIG. 2C). In variants, selection of payloads at S222*b* and validation of payloads at S223 is performed iteratively until at least one set of payloads is identified that satisfies the constraints imposed by the selected spacecraft platform (e.g., as shown in FIG. 2C).

In some implementations, if no valid set of payloads is identified at an iteration of S223, then an iteration of S222*b* is performed, during which at least one subset of a set of payloads invalidated at the iteration of S223 is selected; processing then proceeds to a subsequent iteration of S223, where at least one subset selected at the iteration of S222*b* is validated. In some implementations, multiple subsets are selected at subsequent iterations of S222*b*, and therefore multiple valid subsets may be identified at subsequent iterations of S223. These multiple subsets can be validated in parallel, sequentially, or in any suitable grouping or manner.

At S222*b*, subsets of a set of payloads invalidated at an iteration of S223 can be selected in any suitable manner. In a first example, for each payload included an invalidated set of payloads, the payload is removed from the invalidated set of payloads and the remaining set of payloads forms a subset. For example, for an invalidated set of 10 payloads, 10 new subsets can be generated, with each new subset excluding a different one of the 10 payloads in the invalidated set of 10 payloads. In a second example, the payloads in the invalidated set of payloads are grouped according to sub-mission. For example, for an invalidated set of 10 payloads that includes 8 payloads for a first sub-mission and 2 payloads for a second sub-mission, two new subsets can be identified: a first subset of 8 payloads for the first sub-mission, and a second set of 2 payloads for the second sub-mission. In a third example, one or more payloads are selected for removal based on results of the validation performed at S223. For example, if the set of payloads was invalidated because of mass constraints, then a payload with the highest mass can be selected for removal (or alternatively, the payload with the lowest mass can be selected for removal). Similarly, if the set of payloads was invalidated because of volume constraints, then a payload with the highest (or lowest) volume can be selected for removal. As a further example, if the set of payloads was invalidated because of power constraints, then a payload with the highest (or lowest) power requirements can be selected for removal. As a further example, if the set of payloads was invalidated because of data constraints, then a payload with the highest (or lowest) data requirements can be selected for removal.

In variants, if all of the payloads required for a rideshare mission cannot be accommodated by a single spacecraft platform, the payloads can be distributed across several spacecraft platforms (e.g., in a manner that satisfies requirements of each individual sub-mission of the rideshare mission).

In variants, there may be several valid subsets of the payloads selected at S222*b* that satisfy the requirements of the selected spacecraft platform. Validating payload selection can include identifying each of these valid subsets of the payloads selected at S222*b*. Each of these valid spacecraft system configurations can be evaluated and selected based on one or more selection criteria, as described herein for S260.

In variants, a set of payloads (selected at S222, S222*b*) is evaluated based on one or more constraints (e.g., at S223), and at least one validated set of payloads that satisfies all constraints is selected. The various constraints (e.g., fixed constraints imposed by the design of the spacecraft platform selected at S221) can be evaluated in any suitable order.

In some implementations, validating payload selection S223 includes determining whether a system configuration that includes the selected spacecraft platform and the selected first set of payloads satisfies one or more of: mass constraints (e.g., at S310 shown in FIG. 3), volume constraints (e.g., at S320), power constraints (e.g., at S330), data constraints (e.g., at S340), dimensional constraints (e.g., at S350), and thermal constraints (e.g., at S360). However, any suitable set of constraints can be used to validate payload selection. In variants, the evaluation system 110 determines whether constraints are satisfied at S223.

Validating a set of payloads based on mass constraints S310 includes: computing a total mass for all payloads in the set of payloads being validated (as identified by the data accessed at S210), and determining whether the total mass is less than a maximum payload mass for the spacecraft platform (e.g., as identified by a spacecraft platform model 122 for the selected spacecraft platform). If the total mass is less than the maximum payload mass, then the set of payloads is validated. In variations, the total mass for all payloads includes a mass for a payload hub selected for the system configuration at S220.

Validating a set of payloads based on volume constraints S320 includes: computing a total volume for all payloads in the set of payloads being validated (as identified by the data accessed at S210), and determining whether the total volume is less than a maximum payload volume for the spacecraft platform (e.g., as identified by a spacecraft platform model 122 for the selected spacecraft platform). If the total volume is less than the maximum payload volume, then the set of payloads is validated. In variations, the total volume for all payloads includes a volume for a payload hub selected for the system configuration at S220.

Validating a set of payloads based on power constraints S330 includes: computing total power requirements for all payloads in the set of payloads being validated (as identified by the data accessed at S210), and determining whether the total power requirements is satisfied by the power supply parameters for the spacecraft platform (e.g., as identified by a spacecraft platform model 122 for the selected spacecraft platform). If the total power requirements is satisfied by the power supply parameters for the spacecraft platform, then the set of payloads is validated. In variations, the total power requirements for all payloads includes power requirements for a payload hub selected for the system configuration at S220.

Validating a set of payloads based on data constraints S340 includes: computing total data requirements for all payloads in the set of payloads being validated (as identified by the data accessed at S210), and determining whether the total data requirements is satisfied by the communication system parameters for the spacecraft platform (e.g., as identified by a spacecraft platform model 122 for the selected spacecraft platform). If the total data requirements is satisfied by the communication system parameters for the spacecraft platform, then the set of payloads is validated. In variations, the total data requirements for all payloads includes data requirements for a payload hub selected for the system configuration at S220.

Validating a set of payloads based on dimensional constraints S350 includes: computing dimensional requirements for all payloads in the set of payloads being validated (as identified by the data accessed at S210), and determining whether the dimensional requirements are satisfied by the dimensions for the spacecraft platform (e.g., as identified by a spacecraft platform model 122 for the selected spacecraft platform). If the dimensional requirements are satisfied by the dimensions for the spacecraft platform, then the set of payloads is validated.

In variants, validating a set of payloads based on dimensional constraints S350 includes performing physical modeling using Computer Aided Design to generate a digital representation of a physical arrangement of the set of payloads that satisfies the dimensional requirements of the spacecraft platform. In variations, digital representation of the physical arrangement includes a physical representation of the payload hub selected for the system configuration at S220. In variations, the dimensional constraints include dimensional constraints of the payload hub selected for the system configuration at S220.

In variations, validating a set of payloads based on dimensional constraints functions to determine whether the set of payloads is physically compatible with the selected spacecraft platform (and optionally the payload hub), meaning that all payloads can fit in the spacecraft in a manner that allows them to fulfill their intended functions.

Validating a set of payloads based on thermal constraints S360 includes: computing thermal requirements for all payloads in the set of payloads being validated (as identified by the data accessed at S210), and determining whether the thermal requirements can be supported by thermal management properties or systems of the spacecraft platform (e.g., as identified by a spacecraft platform model 122 for the selected spacecraft platform). If the thermal requirements are satisfied by the spacecraft platform, then the set of payloads is validated. In variations, thermal requirements include thermal requirements for a payload hub selected for the system configuration at S220. In variants, validating a set of payloads based on thermal constraints S360 includes validating that a physical arrangement of payloads that satisfies the dimensional constraints also satisfies the thermal requirements. For example, an arrangement payloads in which a payload that is sensitive to heat is adjacent to a payload that generates heat might not satisfy the thermal requirements of the heat sensitive payload.

Figure 2A:
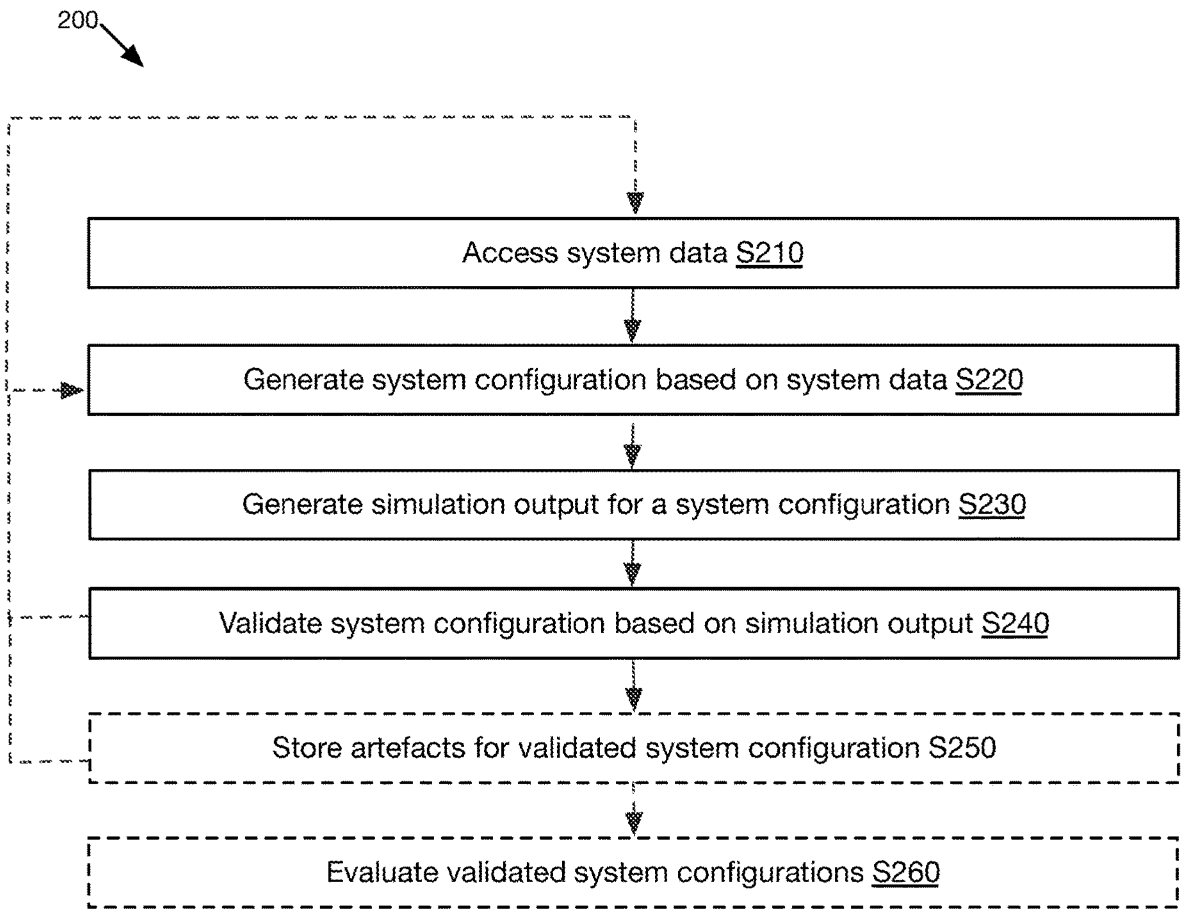
FIGS. 2A-C and 3 are schematic representations of methods, in accordance with embodiments.
Figure 2B:
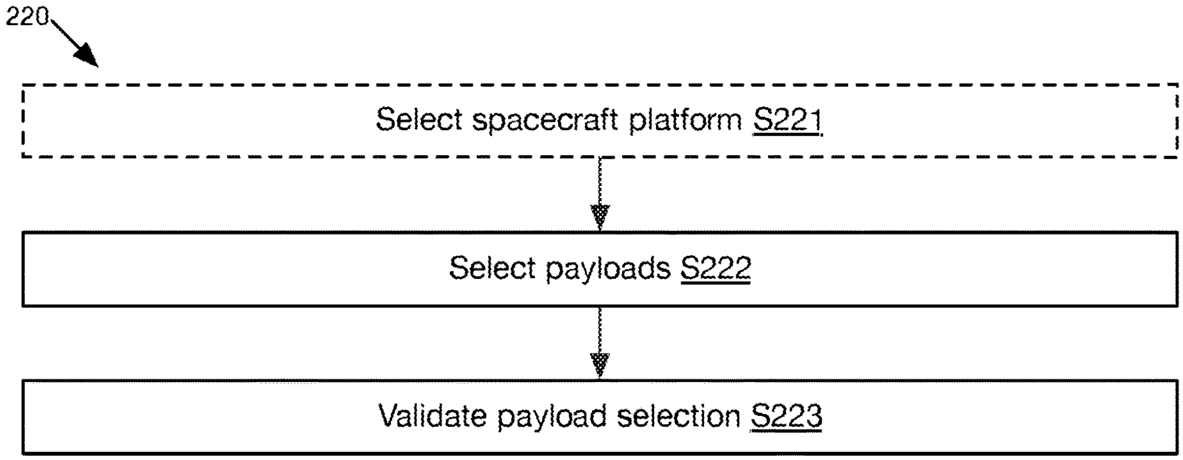
Figure 2C:
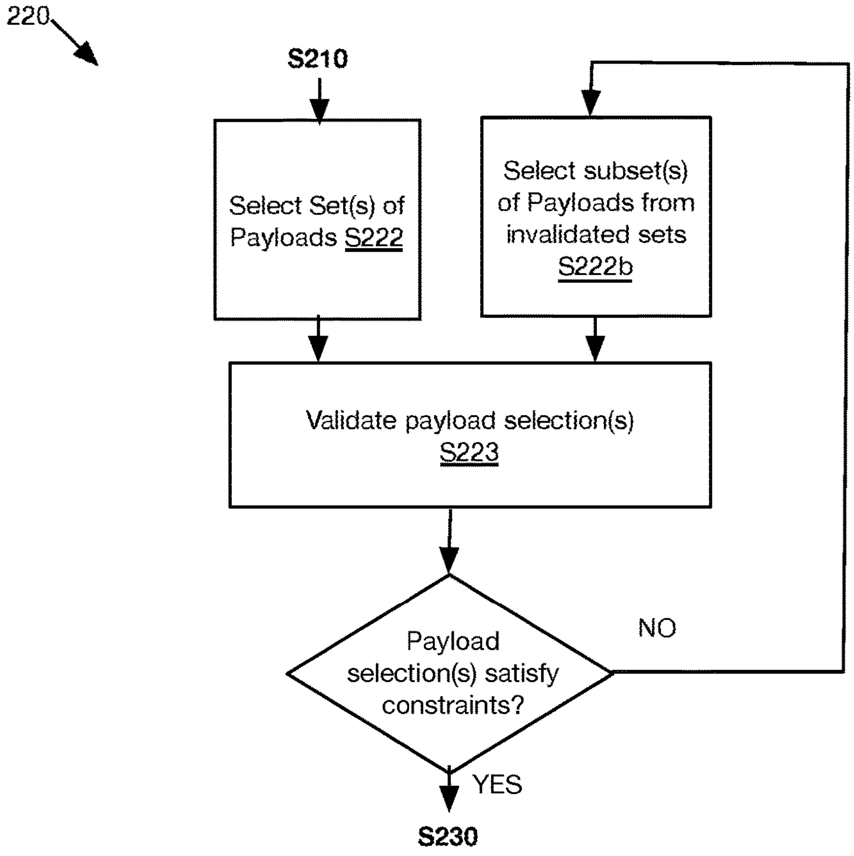
Figure 3:
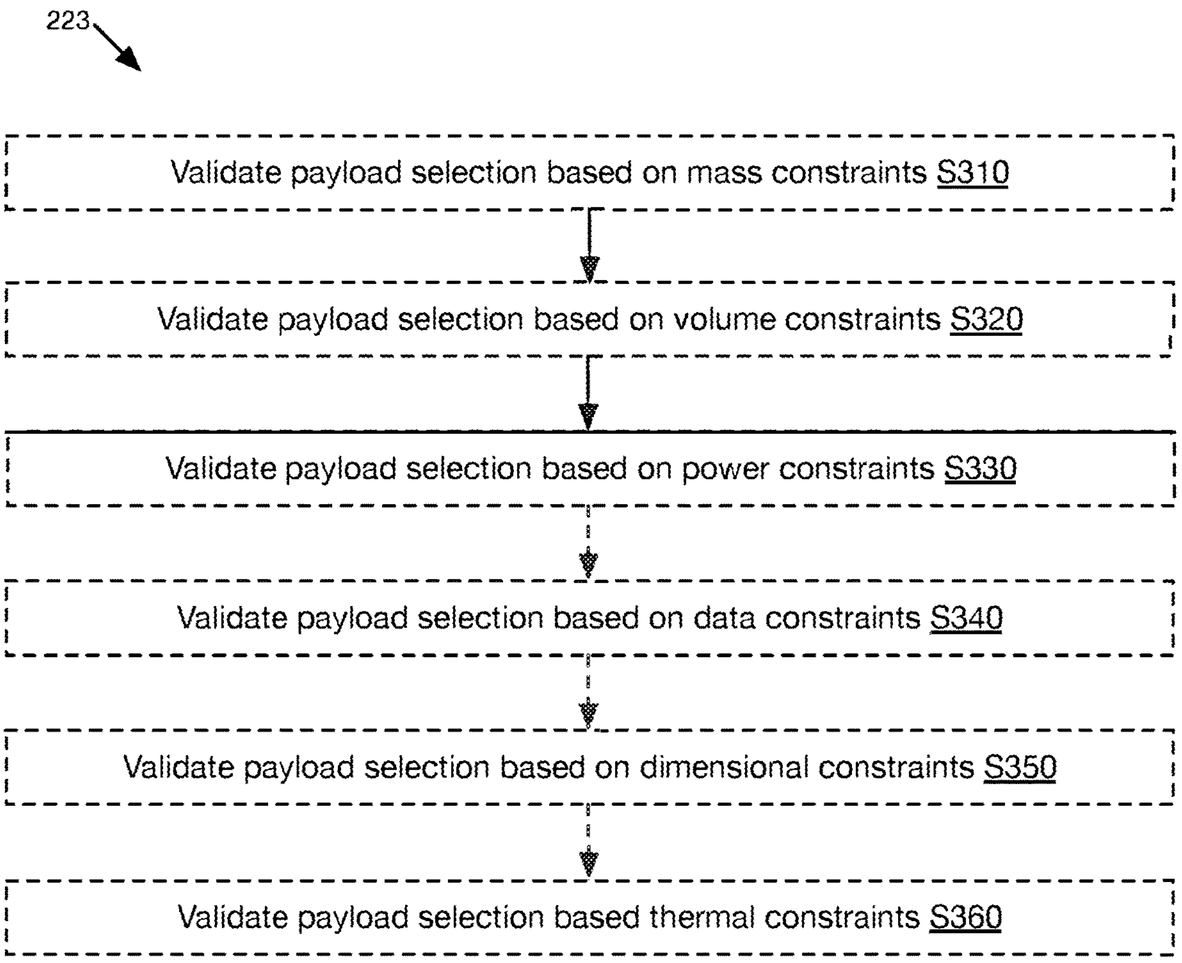

Reverting to FIG. 2A, generating simulation output for a system configuration S230 functions to generate simulated data for at least one system configuration (e.g., 510 shown in FIG. 5A, 520 shown in FIG. 5B) generated at S220. For each system configuration being simulated, simulated data can be generated based on an initial state of the system configuration (e.g., a spacecraft system), and optionally one or more of: mission requirements, orbital parameters (e.g., 129), orbital environment (e.g., 499 shown in FIG. 4A), control values, and environment values. Several system configurations can be generated at S220, and simulated output can be generated for each system configuration (or selected system configurations). A plurality of system configurations can be simulated in parallel, sequentially, or in any suitable grouping or manner.

Figure 5B:
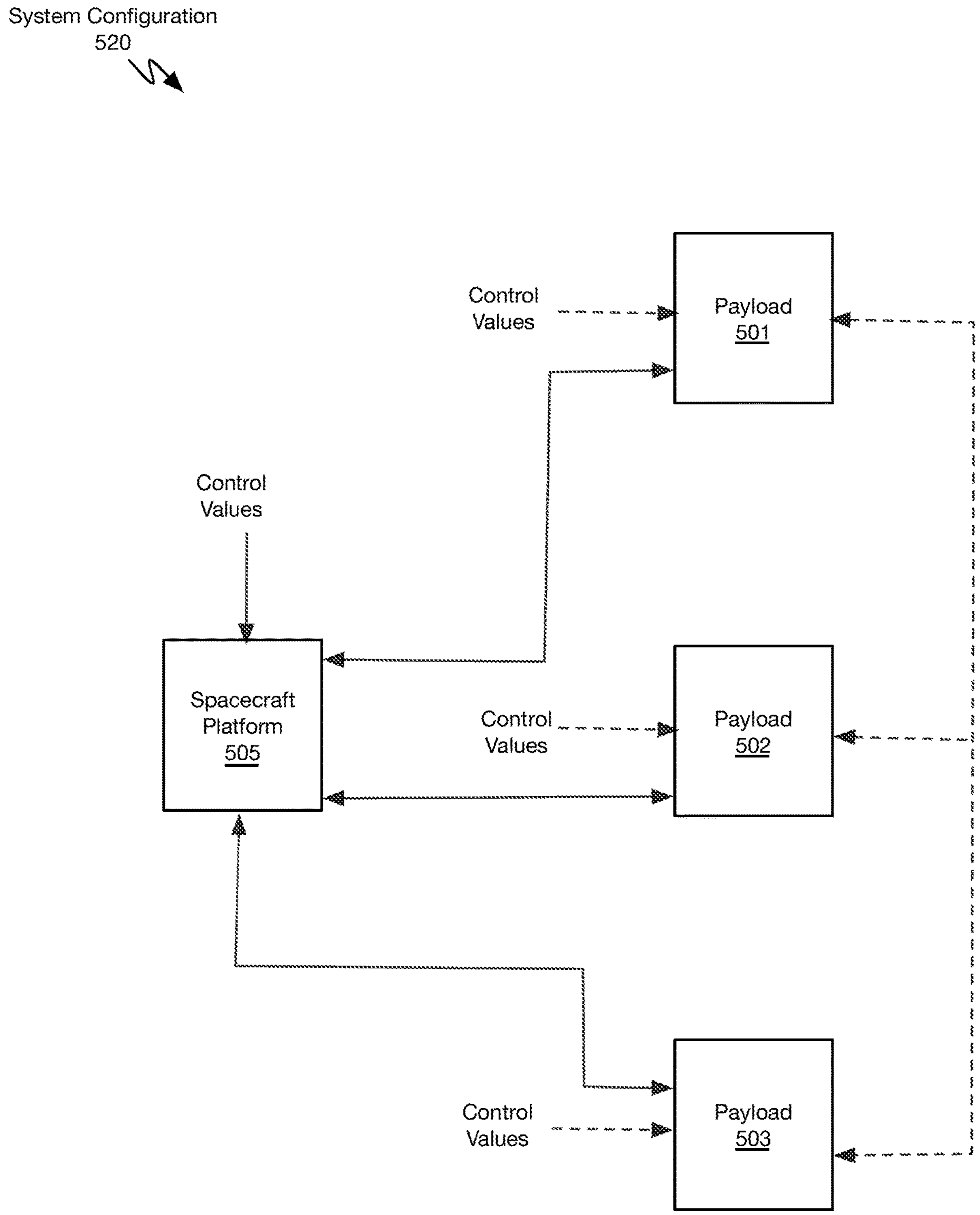

FIGS. 5A-B show exemplary system configurations. FIG. 5A shows a configuration 510 for a spacecraft system includes three payloads 501-503, a payload hub 504, and a spacecraft platform 505. As shown in FIG. 5A, the payload hub generates hub control outputs based on control values, and the payloads generate simulated output based on hub control values generated by the hub model. FIG. 5B shows a configuration 520 for a spacecraft system that includes three payloads 501-503, and a spacecraft platform 505.

Generating simulation output for a system configuration S230 can include generating values for one or more system parameters at various times. System parameters can include one or more of the following for one or more components of the system (or for the system as a whole): power use, available power, stored power, generated power, heat dissipation, heat absorption, electromagnetic radiation generation, electromagnetic radiation absorption, downlink data, uplink data, communication system parameters, power supply parameters, housekeeping activity logs, stored data, available data storage capacity, generated data, system orbital position, and system orientation. However, any suitable parameters can be simulated. In variants, the simulation is performed by using the operational simulator 112. In some implementations, the operational simulator executes (or is communicatively coupled to a system that executes) Space-Based Payload Operations simulation software.

In variants, generating simulation output S230 includes running a simulation by using one or more of a simulation definition 125, orbital parameters 129, mission requirements 126, a ground station model 128, a payload model 121, a spacecraft platform model 122, and a payload hub model 123.

In some implementations, a simulation includes orbital parameters that define an orbital path to be used for the simulation (and optionally one or more specific spacecraft orientations for at least one location along the orbital path). In variants, the operational simulator 112 determines the orbital parameters based on the mission requirements for the mission to be simulated. In variants, the operational simulator 112 determines control values for at least one component of the system configuration based on the orbital parameters and parameters of the system configuration. For example, the operational simulator 112 can determine control values required to navigate the system configuration along the orbital path, based on system properties identified by the system configuration (e.g., the models associated with components of the system configuration). The operational simulator 112 can also identify actions to be performed by one or more components of the system configuration, based on the orbital path and the mission requirements. For example, if a sub-mission of the simulation being simulated includes capturing an image at a specific location with a specific payload, the simulator can simulate the image capture of the payload when the simulated position along the orbital path coincides with the specific location.

In variants, the operational simulator 112 generates simulation output based on the initial state of the system configuration, and the actions performed by the system configuration during the simulation. For example, each action might consume power or generate heat, and thus performance of the actions can affect simulated output values for power and thermal parameters. Similarly, actions that result in data generation and/or transmission, can affect simulated output values for storage system and communication system parameters.

In an example, operation of the system configuration is simulated over a set of orbits, and the output of the simulation is a timeline showing simulated values for one or more system parameters over time.

Validating system configuration S240 can include validating one or more system configurations (e.g., 510 shown in FIG. 5A, 520 shown in FIG. 5B) based on simulated output generated for each system configuration. A plurality of system configurations can be validated based on simulated output in parallel, sequentially, or in any suitable grouping or manner. In variations, the evaluation system 110 (or a component of the evaluation system, e.g., the configuration validator 113) validates system configuration at S240. However, any suitable component of the system 100 can validate system configuration at S240.

Validating a system configuration (e.g., 510, 520) based on simulation output S240 can include comparing the simulated values generated for the system configuration (for one or more system parameters) with a set of constraints. In variants, constraints are defined (e.g., in data stored in the repository 120) for one or more simulated system parameters. The system configuration is validated by comparing the simulated values for a parameter with the corresponding parameter constraints. The results of the comparison can identify whether the system configuration is feasible for the mission being simulated. In variants, parameter constraints include one or more of threshold values, ranges, rules, and the like. Comparing simulated values with constraints can include verifying that the simulated values satisfy the constraints.

Constraints can include constraints defined by the mission requirements 126, or performance requirements. Performance requirements can include requirements that the system does not run out of power, run out of data storage, drop data packets due to insufficient bandwidth, or otherwise fail to perform in any aspect. In variants, the configuration validator validates the system configuration based on the simulation output.

In an example, validating based on simulation output includes ensuring that a spacecraft system with a given payload arrangement and mission configuration can withstand and deliver certain a level of performance, by simulating performance levels and potential conflicts of the payloads operating on the spacecraft system.

For example, validating based on simulation output can function to ensure that the system configuration did not run out of power at any point during a simulated mission, or that the system configuration had adequate storage to store the generated payload data until it could be downlinked (e.g., to a ground station).

In some examples, conflicts between payloads can occur if payloads compete for a same limited resource (e.g., electrical power, unobstructed access to Earth-facing areas of the spacecraft system), or by interacting with other payloads (e.g., by heat generation or electromagnetic interferences). In some examples, conflicts between payloads can occur when non-compatible actions are requested simultaneously (e.g., simultaneous requests to position the spacecraft system in different directions, or to be downlinking more data than possible in a single satellite communication pass with the data rate supplied by the spacecraft platform).

In some variations, in a case where a system configuration is determined to be invalid at S240, processing returns to S220, where the invalid system configuration is updated. In some implementations, updating the system configuration includes one or more of selecting a different spacecraft platform (e.g., 505) (e.g., at S221) and selecting a new set of payloads (e.g., 501-503) (e.g., at S222). Updating the system configuration optionally includes validating payload selection for the updated system configuration (e.g., at S223). Accordingly, invalid system configurations are reconfigured not by changing a design of a spacecraft platform (used by the system), but rather by updating selection of components (or physical arrangement of components) included in the spacecraft system being configured. In other words, the components included in the spacecraft system do not need to be re-designed. In variants, simulation output is generated for the updated system configuration (e.g., at S230), and the updated system configuration is validated based on the simulation output (e.g., S240).

Storing artefacts for a valid system configuration S250 can include storing artefacts for one or more system configurations (e.g., 510 shown in FIG. 5A, 520 shown in FIG. 5B) validated at S240. Artefacts for plurality of system configurations can be stored in parallel, sequentially, or in any suitable grouping or manner. In variations, the evaluation system 110 (or a component of the evaluation system, e.g., the artefact generator 114) stores artefacts at S250. However, any suitable component of the system 100 can store artefacts at S250.

Artefacts for validated system configuration can include information generated at one or more of S220, S230 or S240. In some implementations, artefacts include system configurations generated at S220, payload validation results (e.g., generated at S223) for one or more system configurations, simulated output generated at S230, system validation results generated at S240, parameter constraints used to perform system validation at S240, and the like. However, artifacts can include any suitable information related to any one or more system configurations.

In an example, artefacts for a system configuration include a simulated operational sequence of the system configuration, together with the combined requirements, constraints, and parameters of the configurations.

In variants, artefacts are stored in the repository 120 in a machine-readable format such that they can be retrieved from the repository in response to execution of a query by any suitable computing system (e.g., 110, 140, 150, 160, etc.). In variants, the artefacts (and other data stored in the repository 120) can be used to generate documentation. Example documentation includes one or more of: Engineering documents, Interface Control Document (ICD), CONOPS reference documents, test procedure documents, test results documents, schedule documents. In some variations, storing artefacts S250 includes generating documentation based on the artefacts, and storing the generated documentation. In some implementations, the documentation is automatically generated. Documentation can include one or more of: functional specifications, requirements documents, test documents, test plans, regulatory compliance documents, system assembly instructions, and the like. However, any suitable type of documentation can be generated.

In variants, the artefacts (e.g., data generated during operational simulation at S230) can be used as an initial Concept of Operations (CONOPS) for a corresponding spacecraft system.

In variants, the artefacts include data for a validated mission generated during operational simulation at S230, and can be used to derive further functional requirements for the spacecraft system. In some implementations, the artefacts can be used as a basis for individual functional tests performed during a spacecraft test campaign. Operational scenarios derived from simulation can be identified by the artefacts, and can be used as a basis for functional and end-to-end testing to ensure that the spacecraft system is able to perform a mission as intended. A mission profile, generated during simulation at S230, can be used to provide input conditions and commands for the functional testing of individual payloads before they are integrated into the spacecraft system (in accordance with a valid system configuration for the spacecraft system). For example, if a mission has a payload operating immediately after the spacecraft system emerges from eclipse, this can serve as input to thermal vacuum testing to ensure that the payload is able to operate when the spacecraft system has just emerged from a cold state.

In variants, artefacts stored at S250 can be used as inputs for processes performed at one or more of: S220 (generating system configuration), S230 (generating simulation output), S240 (validating system configuration), and S250 (evaluating validated system configurations).

Evaluating validated system configurations S260 can include one or more of: accessing data for one or more system configurations from the repository 120, displaying data for one or more system configurations, and selecting at least one system configuration. Configurations can be selected automatically based on selection criteria (such as threshold values, rules, optimization criteria etc.), or selected in response to user input received via one or more of an API, a user interface, and a network interface. In variants, selection criteria includes optimization criteria.

In variations, the evaluation system 110 (or a component of the evaluation system, e.g., the trade space visualizer 116) evaluates validated system configurations at S260. However, any suitable component of the system 100 can evaluate validated system configurations at S260.

In variants, evaluating validated system configurations includes displaying data for one or more system configurations (e.g., in a user interface), along with pre-defined selection criteria. Information can be displayed in any suitable manner, such as by using a histogram, scatter plot, parallel coordinate plot, and the like. In variants, evaluating validated system configurations includes displaying a user interface that provides a user-friendly interpretation of complex design trades by identifying and labeling clusters of similar system configurations and visually depicting Pareto fronts. However, validated system configurations (and related data) can be otherwise displayed for selection by a user.

In variants, selection criteria includes optimization criteria. Example selection criteria can include one or more of: revenue, cost, risk, schedule (e.g., launch schedule), preferred rideshare customer. However, any suitable selection criteria can be used. In a first example, selection can be optimized to schedule an earlier launch, even if doing so might provide less revenue or incur more cost. In a second example, selection can be optimized to satisfy a specific customer need (e.g., of a high-priority rideshare customer), even if doing so might provide less revenue or incur more cost. However, selection of a validated system configuration can be performed in any suitable manner.

In an example, selection criteria is represented as a rule with thresholds (or ranges) for revenue, cost and risk values, optionally weighted with respective weight values. Revenue values can represent one or more of: revenues from flying all payloads, revenues associated with each payload (e.g., a yearly fee multiplied by the number of years committed in a service level agreement, plus any additional payment). Cost values can represent one or more of: cost of flying all payloads, number of campaigns required to fly all payloads, average cost of a campaign (e.g., including spacecraft platform, ground segment use, launch service, regulatory licensing fee, etc.), and cost of insurance for each payload. Risk values can represent one or more of: duration of delay in payload development, duration of delay in sales contract execution, maximum acceptable probability of remote sensing license rejection. In variants, risk values can represent, for each payload, probability of failure of the payload after N years.

Embodiments of the system and/or method can include every combination and permutation of the various system components and the various method processes, wherein one or more instances of the method and/or processes described herein can be performed asynchronously (e.g., sequentially), concurrently (e.g., in parallel), or in any other suitable order by and/or using one or more instances of the systems, elements, and/or entities described herein.

As a person skilled in the art will recognize from the previous detailed description and from the figures and claims, modifications and changes can be made to the disclosed embodiments without departing from the scope of this disclosure defined in the following claims.

We claim:

1. A satellite system comprising:

a satellite bus;

one or more satellite systems communicatively coupled to the satellite bus, each configured to perform one or more satellite functionalities;

one or more software satellite payloads, each configured to perform one or more payload missions; and an interface hub communicatively coupled between the satellite bus and the one or more software satellite payloads, the interface hub comprising a hardware processor and a non-transitory computer-readable storage medium storing executable instructions that, when executed by the hardware processor, cause the interface hub to:

provide an application programming interface (API) for each of the set of satellite systems to the one or more software satellite payloads and a standardized command set that can be used to control each of the software satellite payloads;

receive one or more commands from a software satellite payload to control operation of a set of the satellite systems;

restrict access to one or more of the set of satellite systems based on permissions assigned to a tenant associated with the software satellite payload;

route the received one or more commands to the set of satellite systems via the corresponding APIs for the satellite systems;

validate that an execution of a first received command by a first satellite system will not consume satellite system resources that constrains an execution of a second received command by a second satellite system;

validate that a configuration of the one or more satellite systems can continue to operate within defined constraints as additional software satellite payloads are added by simulating, prior to instantiating the additional software satellite payloads, an aggregate resource usage of the one or more satellite systems and the additional software satellite payloads and determining that the simulated aggregate resource usage remains below satellite system constraints by determining that a performance level committed to a first tenant associated with a first software satellite payload already instantiated is not reduced by instantiation of the additional software satellite payloads associated with a second tenant; and cause the set of satellite systems to perform one or more functionalities of the set of satellite systems based on the one or more commands.

2. The satellite system of claim 1, wherein the one or more satellite systems includes satellite hardware provided by a manufacturer or owner of the satellite system.

3. The satellite system of claim 1, wherein the one or more satellite systems includes a hardware payload provided by either an owner of the satellite system or a third party.

4. The satellite system of claim 1, wherein the one or more satellite systems includes a communication hardware system.

5. The satellite system of claim 4, wherein the one or more commands from the software satellite payload configure the communication hardware system to send one or more communications via the communication hardware system.

6. The satellite system of claim 1, wherein the one or more satellite systems includes a satellite movement hardware system.

7. The satellite system of claim 6, wherein the one or more commands from the software satellite payload configure the satellite movement hardware system to change an orientation, rotation, or position of the satellite system.

8. The satellite system of claim 1, wherein the one or more satellite systems includes a propulsion system.

9. The satellite system of claim 8, wherein the one or more commands from the software satellite payload configure the propulsion system to change an orbit, altitude, or location of the satellite system.

10. The satellite system of claim 1, wherein the one or more satellite systems includes a computing system or one or more hardware processors.

11. The satellite system of claim 10, wherein the one or more commands from the software satellite payload configure the computing system or one or more hardware processors to perform one or more operations and to provide a result of the one or more operations to the software satellite payload.

12. The satellite system of claim 1, wherein the one or more satellite systems includes a computing system or one or more sensor systems.

13. The satellite system of claim 12, wherein the one or more commands from the software satellite payload configure the one or more sensor systems to be repositioned or reconfigured.

14. The satellite system of claim 12, wherein the one or more sensor systems comprise one or more cameras.

15. The satellite system of claim 14, wherein the one or more commands from the software satellite payload configure the one or more cameras to capture an image and communication the image via a hardware communication system of the satellite system after the satellite system has been moved into a new orientation, location, position, or altitude.

16. The satellite system of claim 15, wherein the one or more commands from the software satellite payload modify an aperture, shutter, or filter of the one or more cameras.

17. The satellite system of claim 12, wherein the one or more sensor systems comprise a radio frequency sensor.

18. The satellite system of claim 12, wherein the one or more sensor systems comprise a weather monitoring instrument or a climate monitor instrument.

19. The satellite system of claim 12, wherein the one or more sensor systems comprise one or more power sources.

20. The satellite system of claim 12, wherein the one or more sensor systems comprise one or more of an astronics system, an avionics system, a horizon sensor, and a transceiver system.

* * * * *